United States Patent [19]

Horio et al.

[11] Patent Number: 5,726,381
[45] Date of Patent: Mar. 10, 1998

[54] AMORPHOUS THERMOELECTRIC ALLOYS AND THERMOELECTRIC COUPLE USING SAME

[75] Inventors: Yuma Horio; Toshiharu Hoshi, both of Shizuoka, Japan

[73] Assignee: Yamaha Corporation, Shizuoka-ken, Japan

[21] Appl. No.: 541,785

[22] Filed: Oct. 10, 1995

[30] Foreign Application Priority Data

Oct. 11, 1994 [JP] Japan .................... 6-245640

[51] Int. Cl.$^6$ .................... H01L 35/16; H01L 35/18; H01L 35/34
[52] U.S. Cl. .................... 136/236.1; 136/201; 136/238; 136/239; 136/240; 136/241; 252/62.3 T
[58] Field of Search .................... 136/201, 236.1, 136/238, 239, 240, 241; 252/62.3 T

[56] References Cited

U.S. PATENT DOCUMENTS

| | | | |
|---|---|---|---|
| 2,902,528 | 9/1959 | Rosi | 136/4 |
| 2,951,105 | 8/1960 | Busanovich | 136/5 |
| 3,159,579 | 12/1964 | Conn | 252/62.3 |
| 4,447,277 | 5/1984 | Jayadev et al. | 148/400 |
| 4,465,895 | 8/1984 | Verner et al. | 136/225 |
| 4,588,520 | 5/1986 | Jayadev et al. | 252/512 |
| 4,717,789 | 1/1988 | Rauch, Sr. et al. | 136/238 |
| 5,108,515 | 4/1992 | Ohta et al. | 136/201 |
| 5,356,485 | 10/1994 | Kreider | 136/225 |

FOREIGN PATENT DOCUMENTS

| | | |
|---|---|---|
| 62-196346 | 8/1987 | Japan . |
| 1-276678 | 11/1989 | Japan . |

OTHER PUBLICATIONS

K. Masui, et al., "Structure and Thermoelectric Properties of the Intermetallic Compounds of $(Bi,Sb)_2(Te,Se)_3$ Alloys", Nagoya Inst. of Tech., Dep. of Electrical & Computer Eng., pp. 155–160, 1993.

H.P. Ha, et al., "Effects of Composition and Process Parameters on the Thermoelectric Properties of n–Type $Bi_2Te_3$–$Bi_2Se_3$ Solid Solutions", 1995 American Institute of Physics, pp. 235–238.

D.M. Rowe, "Recent Developments in Thermoelectric Materials", Applied Energy, vol. 24, 1986, pp. 139–162.

*Primary Examiner*—Kathryn L. Gorgos
*Assistant Examiner*—Chrisman D. Carroll
*Attorney, Agent, or Firm*—Ostrolenk, Faber, Gerb & Soffen, LLP

[57] ABSTRACT

Thermoelectric material contains one or more than one element selected from the transition metals and the rare earth metals, and the element promotes the amorphous phase in the thermoelectric material so as to increase the figure of merit.

16 Claims, 5 Drawing Sheets

AMORPHOUS THERMOELECTRIC ALLOYS AND THERMOELECTRIC COUPLE USING SAME

FIELD OF THE INVENTION

This invention relates to amorphous thermoelectric alloys and, more particularly, to amorphous thermoelectric alloys improved in figure of merit and a thermoelectric couple formed of the amorphous thermoelectric alloy and available for a thermoelectric generation and a thermoelectric refrigeration.

DESCRIPTION OF THE RELATED ART

When a material forms a loop together with a different material, two thermojunctions take place. If one of the thermojunctions is heated and the other is cooled, thermoelectric current flows through the loop due to the temperature difference between the thermojunctions. This phenomenon is known as "Seebeck effect".

On the other hand, when electric current flows across the thermojunctions, an exoergic phenomenon and an endoergic phenomenon respectively take place at the thermojunctions, and are called as "Peltier" effect".

Electric current flowing along a temperature gradient given to a homogeneous material causes the exoergic phenomenon and the endoergic phenomenon to take place in the homogeneous material, and the phenomenon is known as "Thomson effect".

These effects, Seebeck effect, Peltier effect and Thomson effect are categorized in the reversible thermoelectric effect. On the other hand, Joule effect and the heat conduction are irreversible, and the reversible phenomena and the irreversible phenomena are selectively combined, and are available for the thermoelectric generation and the thermoelectric refrigeration.

FIG. 1 illustrates the thermoelectric refrigerator equipped with a thermoelectric converting device. A p-type thermoelectric element 1 and an n-type thermoelectric element 2 are contacted with a metal electrode 3 in a pi-configuration, and metal electrodes 4a and 4b are held in contact with the opposite surface of the p-type thermoelectric element 1 and the opposite surface of the n-type thermoelectric element 2. A direct-current source 5 is connected between the metal electrodes 4a and 4b, and applies a positive potential and a negative potential to the metal electrode 4b and the other metal electrode 4a, respectively. Current flows through the metal electrodes 4a and 4b, and the exoergic phenomenon and the endoergic phenomenon take place at the metal electrode 3 and the metal electrodes 4a and 4b, respectively. If the metal electrode is held in contact with an object to be cooled, heat is taken from the object so as to cool it.

The figure of merit is used for an evaluation of the thermoelectric converting device, and is expressed by equation 1.

$$Z = \alpha^2 \sigma / \kappa \qquad \text{Equation 1}$$

where Z is the figure of merit, alpha is Seebeck coefficient, sigma is electric conductivity and kappa is heat conductivity. A thermoelectric material with large figure of merit is superior to another thermoelectric material with small figure of merit.

A typical example of the thermoelectric material is disclosed in Japanese Patent Publication of Unexamined Application No. 62-196346, and has the composition expressed by chemical formula 1

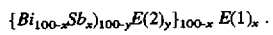

where E(1) is an element of Group II or Group IV and E(2) is an element of Group IV or Group VI.

FIG. 2 shows the figure of merit of various p-type thermoelectric materials. The thermoelectric materials in the Bi—Sb system are large in figure of merit at room temperature, and is desirable for a refrigeration device at room temperature.

Japanese Patent Publication of Unexamined Application No. 1-276678 discloses thermoelectric materials in the Bi—Sb—Te—Se system. According to the Japanese Patent Publication of Unexamined Application, thermoelectric material in the $(Bi, Sb)_2(Te, Se)_3$ system is quenched for solidification. The solidified thermoelectric material is either amorphous or crystallite, and is enhanced in the figure of merit.

However, the figure of merit of these prior art thermoelectric materials is only of the order of $2.5 \times 10^{-3}$ (1/K), and is too small to satisfy the need of practical usages.

SUMMARY OF THE INVENTION

It is therefore an important object of the present invention to provide a thermoelectric material which has large figure of merit.

It is also an important object of the present invention to provide a thermoelectric couple which is available for practical usages.

To accomplish these objects, the present invention proposes to make a thermoelectric material amorphous or crystallite by adding transition metal and rare earth metal.

In accordance with one aspect of the present invention, there is provided a thermoelectric material expressed by the general formula of $\{A_xB'_yC'_z\}_{100-a}D_a$ where A is at least one element selected from the group consisting of Bi and Sb, B' is at least one element selected from the group consisting of S, Te and Se, C' is at least one element selected from the group consisting of Ti, V, Cr, Mn, Fe, Co, Ni, Cu, Zn, Zr, Nb, Mo, Y, La, Ce, Nd, Sm and Mm, D is at least one metal or compound selected from the group consisting of Pb, Cd, Li, Ag, CuI, CuBr, AgI, $SbI_3$, $HgBr_2$ and $HgCl_2$, x, y and z are atomic percent ranging as follows x+y+z=100, $20 \leq x \leq 60$, $40 \leq y \leq 80$, $0.05 \leq z \leq 20$, a is weight percent ranging as follows $0 \leq a \leq 15$.

In accordance with another aspect of the present invention, there is provided a thermoelectric converting element expressed by the general formula of $\{A_xB'_yC'_z\}_{100-a}D_a$ where A is at least one element selected from the group consisting of Bi and Sb, B' is at least one element selected from the group consisting of S, Te and Se, C' is at least one element selected from the group consisting of Ti, V, Cr, Mn, Fe, Co, Ni, Cu, Zn, Zr, Nb, Mo, Y, La, Ce, Nd, Sm and Mm, D is at least one metal or compound selected from the group consisting of Pb, Cd, Li, Ag, CuI, CuBr, AgI, $SbI_3$, $HgBr_2$ and $HgCl_2$, x, y and z are atomic percent ranging as follows x+y+z=100, $20 \leq x \leq 60$, $40 \leq y \leq 80$, $0.05 \leq z \leq 20$, a is weight percent ranging as follows, $0 \leq a \leq 15$, and having one of an amorphous phase, a crystallite phase and a mixed phase between the amorphous phase and the crystallite phase obtained through a quenching operation at $10^4$ to $10^6$ K°/second. "Mm" represents misch metal.

The thermoelectric material may have an amorphous phase, a crystallite phase and a mixed phase between the amorphous phase and the crystallite phase obtained through a quenching at $10^4$ to $10^6$ K°/second.

The crystallite phase has a structure containing crystal grains equal to or less in average grain diameter than 50 microns. It is more appropriate for the crystallite phase to be equal to or less in average grain diameter than 10 microns.

A thermoelectric converting element may be formed from a powder solidification technique such as hot pressing, extrusion molding and impact extrusion technique. The thermoelectric converting element may be a thin layer.

According to the present invention, at least one transition metal and at least one rare earth metal are added to the thermoelectric material containing at least two elements selected from Bi, Sb, Te and Se so as to introduce strain into the crystal structure of the thermoelectric material. The strain promotes the amorphous phase during the quenching, and the amorphous phase enhances the figure of merit.

The heat conductivity is proportional to the mean free path of phonon, and a geometric scattering due to an imperfect crystal structure and a phonon scattering affect the mean free path. The mean free path of the amorphous thermoelectric material is strongly of the geometric scattering, and is relatively small. For this reason, the heat conductivity of the thermoelectric material is smaller than that of the prior art.

The amorphous thermoelectric material creates an energy band-gap between the conduction band and the valence band where a large amount of trapping levels take place, and the large amount of trapping levels deteriorate the mobility of the carrier, i.e., electron and hole. This results in low electric conductivity. On the contrary, amorphous phase increases the thermoelectromotive force of the material or Seebeck coefficient. As will be understood from equation 1, the Seebeck coefficient is squared in the equation, and, accordingly, strongly affects the figure of merit. Although the electric conductivity is decreased, the small heat conductivity and the large Seebeck coefficient increase the figure of merit.

If the thermoelectric material according to the present invention is the crystallite, the figure of merit is increased similar to the amorphous phase, and the crystallite thermoelectric material according to the present invention achieves a large figure of merit.

The thermoelectric material according to the present invention contains the transition metal or metals represented by element C', and the transition metal promotes the amorphous phase of the thermoelectric material during the quenching. Moreover, the transition metals are quite different in atomic radius from Bi, Sb and Te, and the difference further promotes the amorphous phase of the thermoelectric material. In order to promote the amorphous phase, it is necessary for element C' to have the atomic ratio z ranging from 0.05 to 20 percent.

Element D serves as a dopant, and regulates the carrier concentration so as to enhance Seebeck coefficient. In order to enhance Seebeck coefficient, element D ranges 0 to 15 by weight percent.

In the compound $\{A_xB'_yC'_z\}$ contained at (100-a) weight percent, the atomic ratio of element A, i.e. Bi and/or Sb ranges from 20 to 60 percent. This is because of the fact that the atomic ratio x out of the range drastically decreases the thermoelectromotive force.

The atomic ratio y of element B', i.e., one or more than one of S, Te and Se, ranges 40 to 80 percent. If the atomic ratio y is less than 40 percent or greater than 80 percent, the thermoelectromotive force is also drastically decreased.

If the quenching speed falls within the range from $10^4$ ° K/seconds second to $10^6$ ° K/second, the thermoelectric material has an amorphous phase, crystallite phase or the mixed phase thereof. The phase enhances the figure of merit as described hereinbefore.

The thermoelectric material may be solidified by using a hot pressing or the like. The thermoelectric material subjected to the quenching is available for a ribbon-shaped thermoelectric converting element without further treatment.

BRIEF DESCRIPTION OF THE DRAWINGS

The features and advantages of the thermoelectric materials and the thermoelectric couple according to the present invention will be more clearly understood from the following description taken in conjunction with the accompanying drawings in which.

DESCRIPTION OF THE PREFERRED EMBODIMENT

Description is hereinbelow made on an embodiment according to the present invention. Tables 1 to 30 shows the composition of specimens according to the present invention and the comparative samples. The specimens and the comparative samples were produced through the following processes, and the figure of merit Z was measured at 300 degrees Kelvin.

The first process was as follows. A rapid quench thin film was firstly formed through a single rolling technique, and was, thereafter, pulverized. The rapid quench thin film was obtained through a rapid quench from melted state of the substance for solidification, and a single rolling method was available for the rapid quench thin film, by way of example. The grain diameter was equal to or less than 50 microns. The powder was hot pressed at 150 to 450 degrees centigrade for 5 to 120 minutes under a pressure ranging between 0.4 ton/cm$^2$ and 8 tons/cm$^2$, and the specimens and the comparative samples were obtained.

The second process was as follows. Quenched powder was produced through a gas-atomizer, and was classified. The powder not greater in grain diameter than 50 microns was solidified by using an impact type compactor. The flyer velocity was 1 to 6 kilometer per second, and the impact pressure was 10 to 250 GPa.

The specimens and the comparative samples were quenched at $10^4$ to $10^6$ ° K/ second, and were in the amorphous phase, the crystallite phase or the mixed phase.

As will be understood from Tables 1 to 30, the specimens according to the present invention achieved a large figure of merit equal to or greater than $6\times10^{-3}$ (1/K), and the comparative samples out of the scope of the present invention ranges between $0.4\times10^{-3}$ to $0.8\times10^{-3}$ (1/K). Thus, the specimens according to the present invention are much larger in the figure of merit than the comparative samples out of the scope of the present invention.

Figure 1:
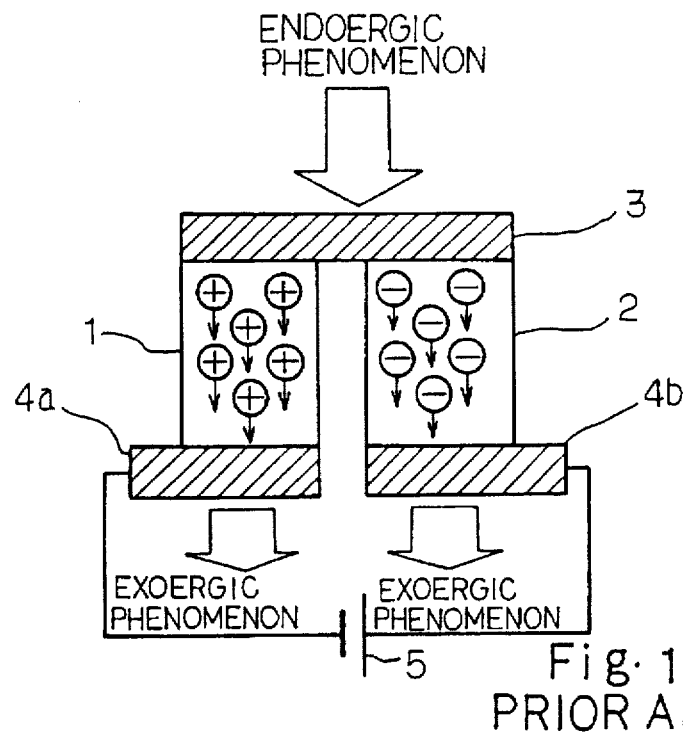
FIG. 1 is a schematic view showing the prior art thermoelectric refrigerator.
Figure 2:
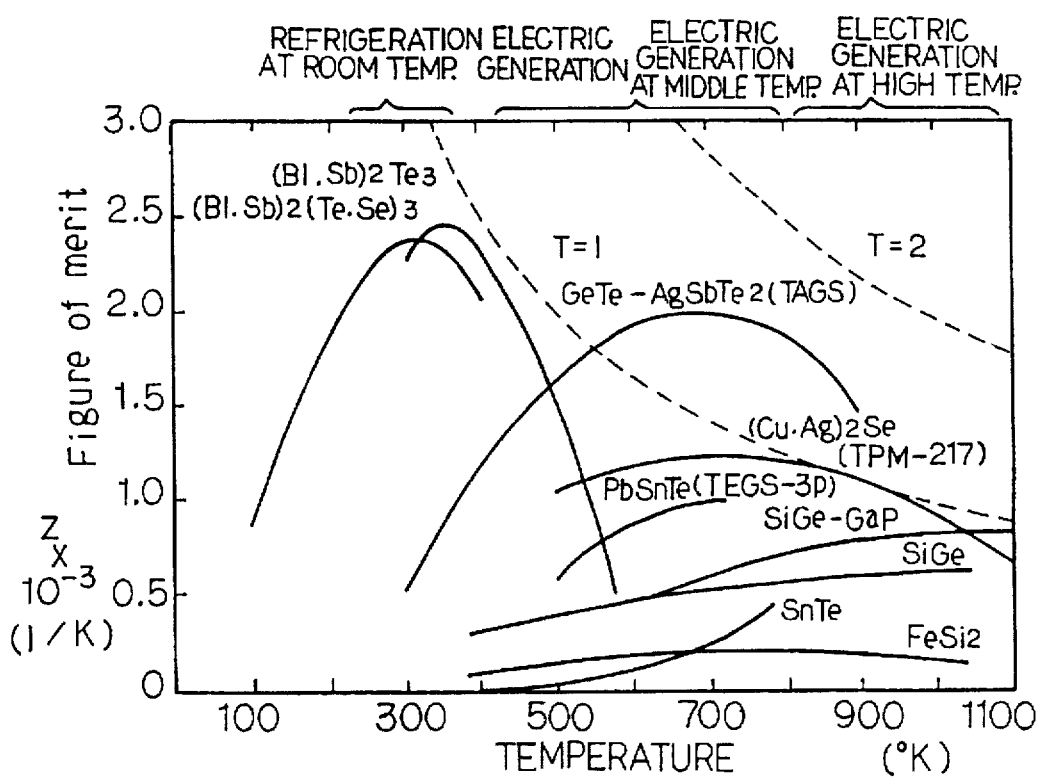
FIG. 2 is a graph showing the figure of merit of the prior art thermoelectric materials.
Figure 3:
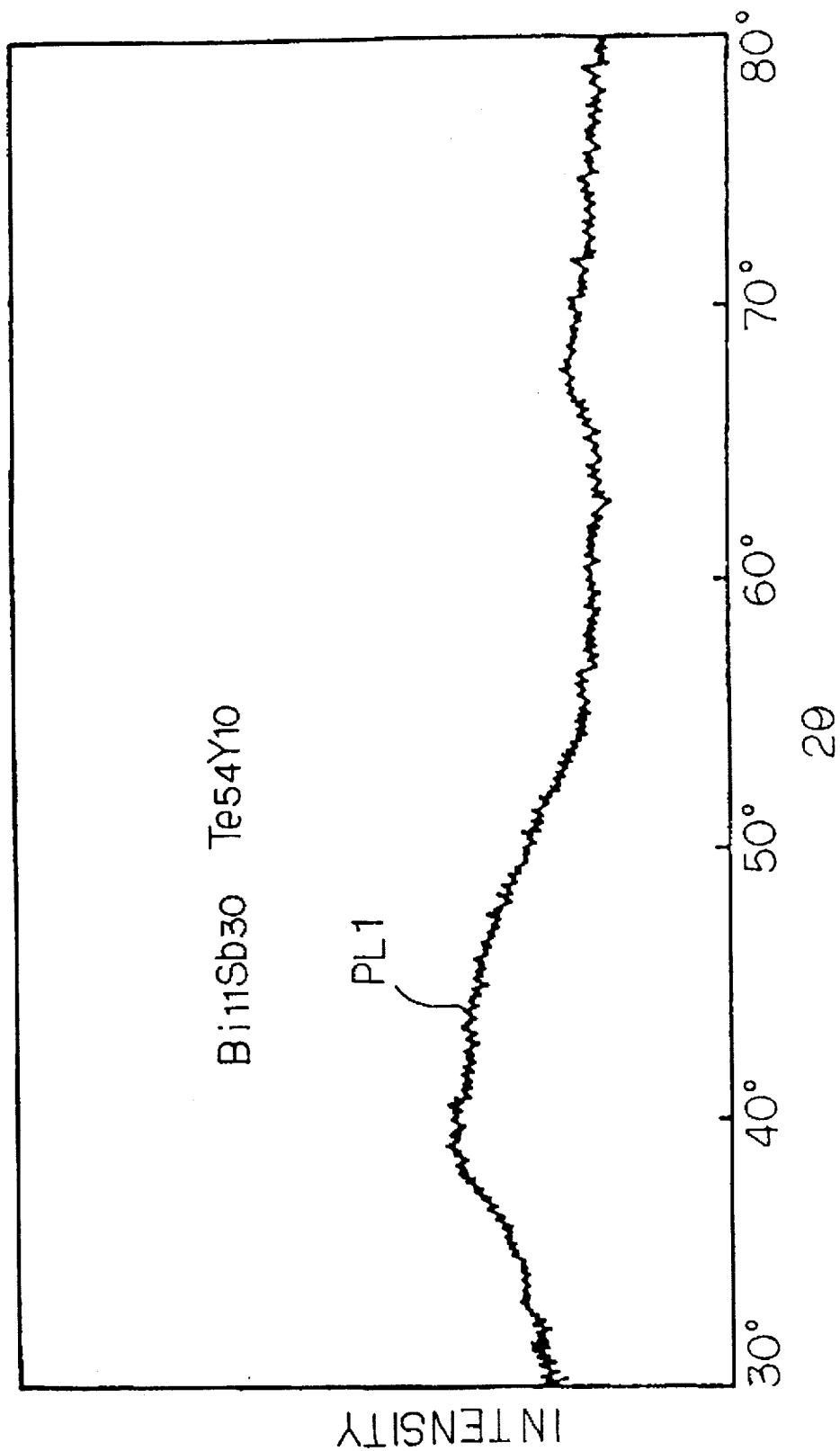
FIG. 3 is a graph showing the amorphous phase of a thermoelectric material according to the present invention.

The present inventors evaluated the crystal of the specimen expressed as $Bi_{11}Sb_{30}Te_{54}Y_{10}$ through an x-ray diffraction, and suffixes of the structural formula are indicative of the atomic percentage. The x-ray diffraction resulted in FIG. 3. Plots PL1 did not have a sharp peak, and this meant that the thermoelectric material did not have a clear crystal phase.

Figure 4:
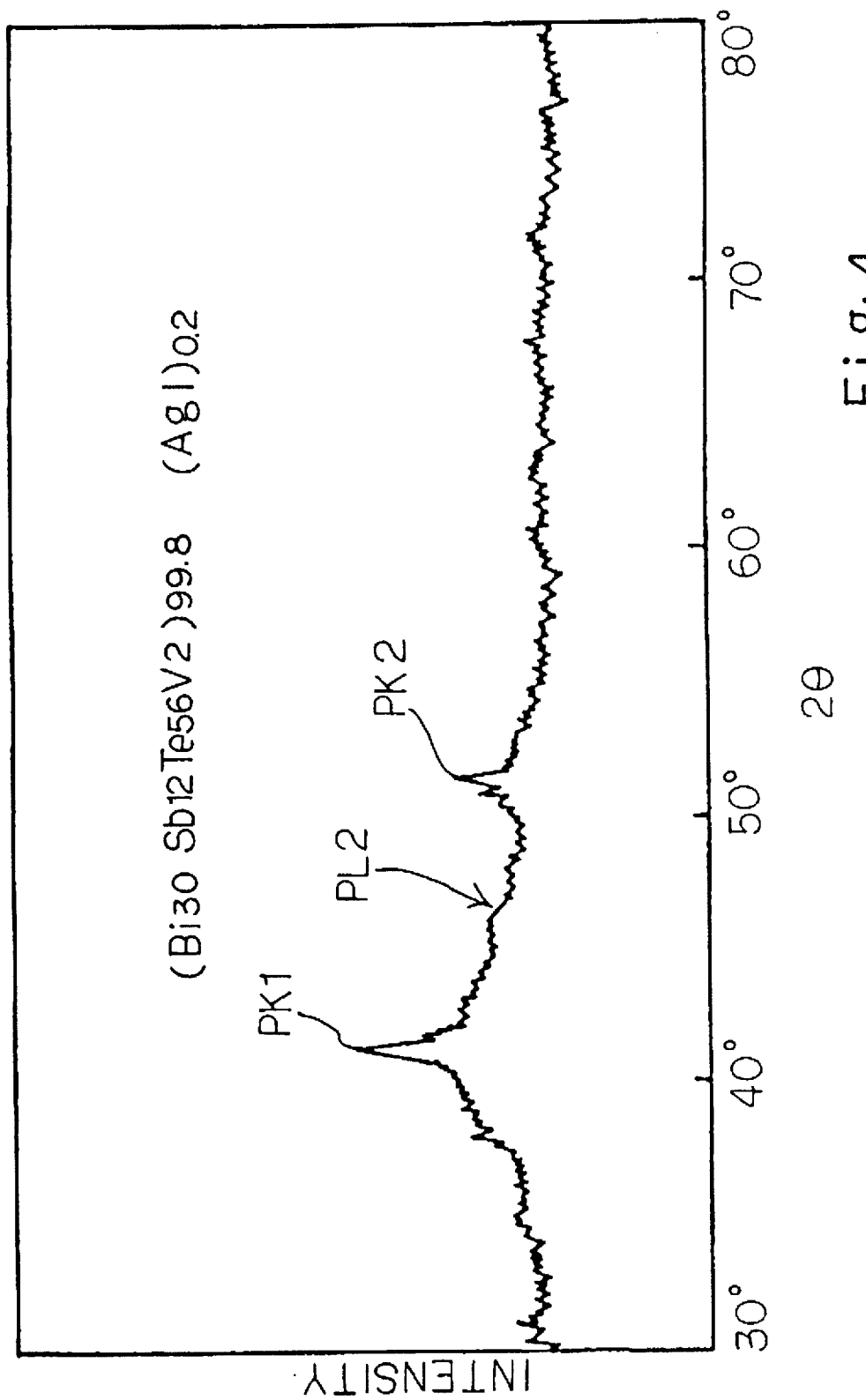
FIG. 4 is a graph showing the mixed phase of another thermoelectric material according to the present invention.

The present inventors further evaluated the crystal of the specimen expressed as $(Bi_{30}Sb_{12}Te_{56}V_2)_{99.8}(AgI)_{0.2}$ through x-ray diffraction. Suffixes 30, 12, 56 and 2 represent the atomic percent, and suffixes 99.8 and 0.2 are the weight percentages. The x-ray diffraction resulted in FIG. 4. Plots PL2 had twin low peaks PK1 and PK2, and the twin low peaks PK1 and PK2 show the presence of crystallites. However, the other plots PL represented the amorphous phase. Thus, the evaluated specimen had a mixed phase.

Figure 5:
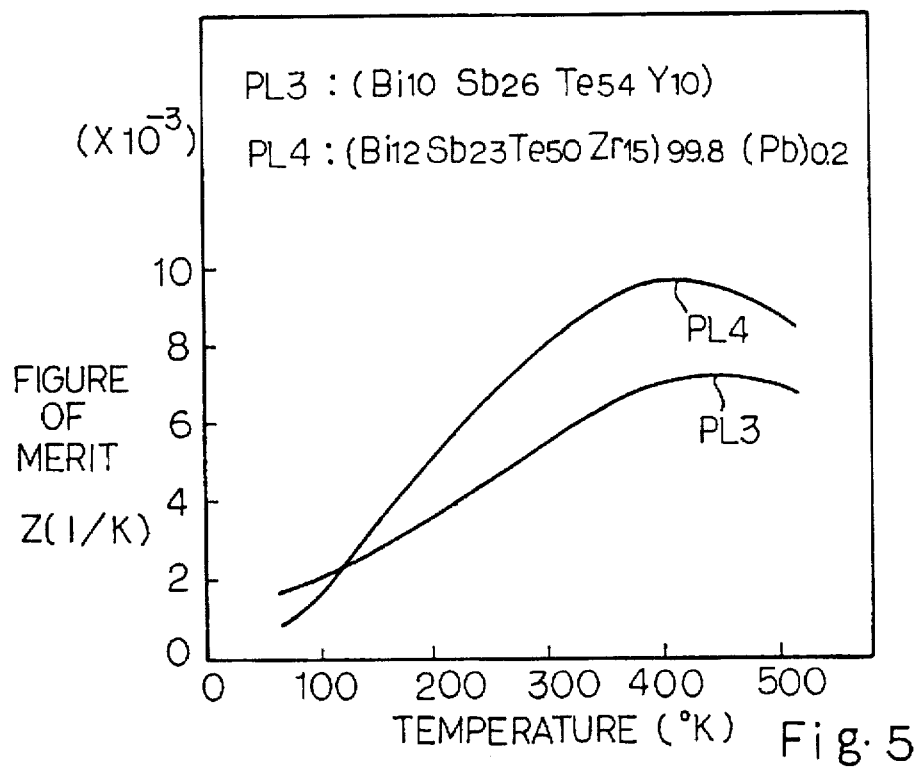
FIG. 5 is a graph showing the figure of merit of thermoelectric materials.

The present inventors measured and calculated the figure of merit of p-type thermoelectric materials, and plotted the figure of merit in FIG. 5. Plots PL3 represented the thermoelectric material expressed by the structural formula of $Bi_{10}Sb_{26}Te_{54}Y_{10}$, and plots PL4 represented the thermoelectric material expressed as $(Bi_{12}Sb_{23}Te_{50}Zr_{15})_{99.8}Pb_{0.2}$.

Figure 6:
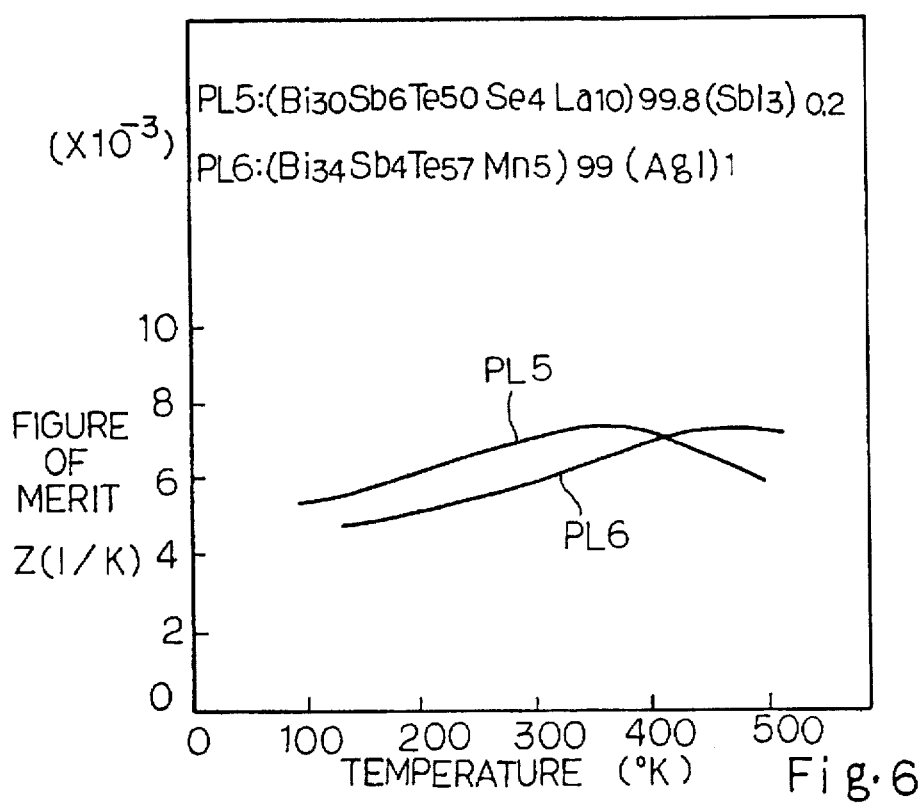
FIG. 6 is a graph showing the figure of merit of thermoelectric materials.

The present inventors further measured and calculated the figure of merit of n-type thermoelectric materials, and plotted the figure of merit in FIG. 6. Plots PL5 represented the thermoelectric material expressed by the structural formula of $(Bi_{30}Sb_6Te_{50}Se_4La_{10})_{99.8}(SbI_3)_{0.2}$, and plots PL6 represented the thermoelectric material expressed as $(Bi_{34}Sb_4Te_{57}Mn_5)_{99}(AgI)_1$.

Figure 7:
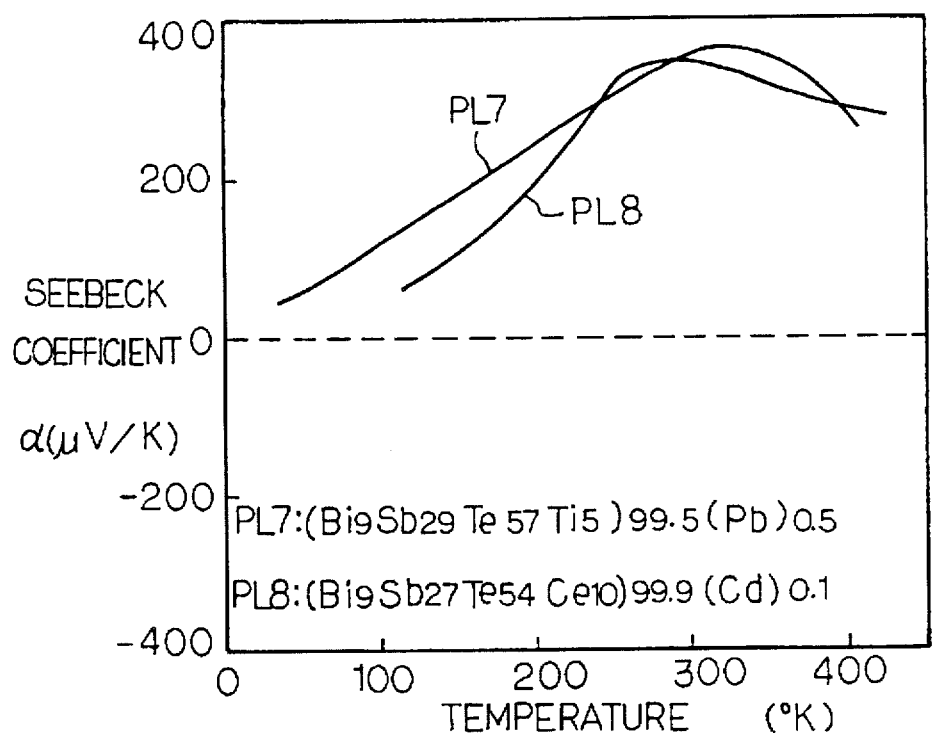
FIG. 7 is a graph showing the Seebeck coefficient of thermoelectric materials.

The present inventors plotted Seebeck coefficient in FIG. 7. Plots PL7 represented the p-type thermoelectric material expressed by the structural formula of $(Bi_9Sb_{29}Te_{57}Ti_5)_{99.5}Pb_{0.5}$, and plots PL8 represented the p-type thermoelectric material expressed as $(Bi_9Sb_{27}Te_{54}Ce_{10})_{99.9}Cd_{0.1}$.

Figure 8:
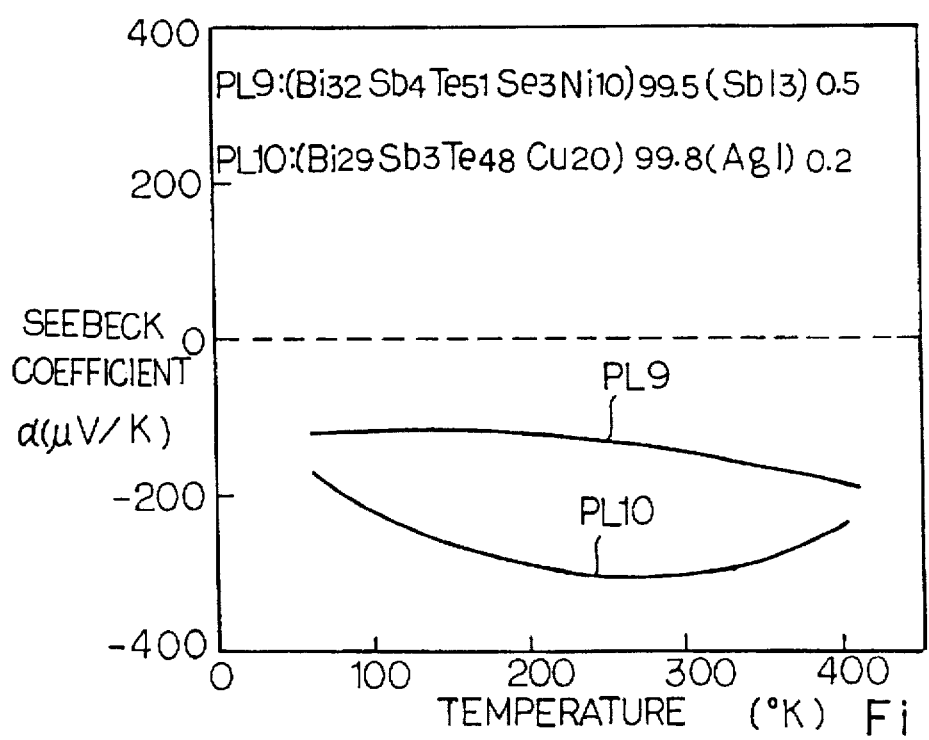
FIG. 8 is a graph showing the Seebeck coefficient of other thermoelectric materials.

The present inventors also plotted Seebeck coefficient in FIG. 8. Plots PL9 represented the n-type thermoelectric material expressed by the structural formula of $(Bi_{32}Sb_4Te_{51}Se_3Ni_{10})_{99.5}(SbI_3)_{0.5}$, and plots PL10 represented the n-type thermoelectric material expressed as $(Bi_{29}Sb_3Te_{48}Cu_{20})_{99.8}(AgI)_{0.2}$.

As will be appreciated from the foregoing description, element C is added to elements A and B so as to promote the amorphous phase or the crystallite phase, and the amorphous phase improves the figure of merit.

Although particular embodiments of the present invention have been shown and described, it will be obvious to those skilled in the art that various changes and modifications may be made without departing from the spirit and scope of the present invention.

TABLE 1

| COMPOSITION (SPECIMENS) | $Z \times 10^3$ (1/K) |
|---|---|
| $Bi_{32}S_{58}Ti_{10}$ | 6.2 |
| $Bi_{35}S_{57}Mn_8$ | 7.1 |
| $Bi_{34}Te_{51}Ti_{15}$ | 6.7 |
| $Bi_{34}Te_{51}Mn_{15}$ | 6.9 |
| $Bi_{32}Se_{58}Ti_{20}$ | 6.8 |
| $Bi_{28}Te_{62}Mn_{10}$ | 6.8 |
| $Bi_{12}Sb_{30}S_{57.95}Ti_{0.05}$ | 6.9 |
| $Bi_{30}Sb_{25}S_{45}Mn_{20}$ | 6.9 |

TABLE 1-continued

| COMPOSITION (SPECIMENS) | $Z \times 10^3$ (1/K) |
|---|---|
| $Bi_{15}Sb_{35}Te_{59}Ti_1$ | 6.8 |
| $Bi_{30}Sb_{30}Te_{59}Mn_1$ | 6.9 |
| $Bi_{10}Sb_{30}Se_{55}Ti_5$ | 6.2 |
| $Bi_{14.43}Sb_{30}Se_{45}Mn_{0.05}$ | 6.8 |
| $Bi_{10}Sb_{20}S_2Te_{50}Ti_{18}$ | 6.7 |
| $Bi_{10}Sb_{20}S_5Te_{51}Mn_{14}$ | 6.7 |
| $Bi_{10}Sb_{25}S_{10}Se_{40}Ti_{15}$ | 6.7 |
| $Bi_{14}Sb_{30}S_{10}Se_{30}Mn_{16}$ | 6.6 |
| $Bi_{33.1}Sb_{3.7}Te_{53.4}Se_{3.8}Ti_8$ | 6.4 |
| $Bi_{33.1}Sb_{3.7}Te_{52.9}Se_{2.8}Mn_8$ | 6.9 |
| $Bi_{32.4}Sb_{3.6}S_{0.7}Te_{51.3}Se_{2.0}Ti_{10}$ | 6.5 |
| $Bi_{32.4}Sb_{3.6}S_{0.7}Te_{51.3}Se_{2.0}Mn_{10}$ | 6.9 |
| $Sb_{33}S_{62}Ti_5$ | 6.3 |
| $Sb_{33}S_{62}Mn_5$ | 6.3 |
| $Sb_{32}Te_{67}Ti_1$ | 6.2 |
| $Sb_{32}Te_{67}Mn_1$ | 6.4 |

TABLE 2

| COMPOSITION (SPECIMENS) | $Z \times 10^3$ (1/K) |
|---|---|
| $Sb_{35}Se_{50}Ti_{15}$ | 6.3 |
| $Sb_{35}Se_{60}Mn_5$ | 6.7 |
| $Bi_{35}S_5Te_{45}Ti_{15}$ | 6.6 |
| $Bi_{35}S_5Te_{45}Mn_{15}$ | 6.6 |
| $Bi_{35}S_5Se_{40}Ti_{20}$ | 7.1 |
| $Bi_{35}S_5Se_{40}Mn_{20}$ | 6.8 |
| $Bi_{30}Te_{50}Se_7Ti_{13}$ | 6.9 |
| $Bi_{30}Te_{50}Se_7Mn_{13}$ | 6.6 |
| $Sb_{33}S_7Te_{45}Ti_{35}$ | 6.9 |
| $Sb_{33}S_7Te_{45}Mn_{15}$ | 7.0 |
| $Sb_{32}Te_{50}Se_5Ti_{13}$ | 6.1 |
| $Sb_{32}Te_{50}Se_5Mn_{13}$ | 6.9 |
| $Sb_{30}S_5Se_{51}Ti_{14}$ | 6.0 |
| $Sb_{30}S_5Se_{51}Mn_{14}$ | 6.9 |
| $Bi_{34.4}S_{0.6}Te_{49}Se_2Ti_{14}$ | 6.9 |
| $Bi_{34.4}S_{0.6}Te_{49}Se_2Mn_{14}$ | 6.8 |
| $Sb_{34.8}S_{0.6}Te_{49.6}Se_2Ti_{13}$ | 6.9 |
| $Sb_{34.8}S_{0.6}Te_{49.6}Se_2Mn_{13}$ | 6.9 |

TABLE 3

| COMPOSITION (SPECIMENS) | $Z \times 10^3$ (1/K) |
|---|---|
| $Bi_{32}S_{58}Zn_{10}$ | 6.8 |
| $Bi_{35}S_{57}Ce_8$ | 6.7 |
| $Bi_{34}Te_{51}Zn_{15}$ | 6.5 |
| $Bi_{34}Te_{51}Ce_{15}$ | 6.8 |
| $Bi_{32}Se_{58}Zn_{20}$ | 6.7 |
| $Bi_{28}Te_{62}Ce_{10}$ | 6.7 |
| $Bi_{12}Sb_{30}S_{57.95}Zn_{0.05}$ | 6.9 |
| $Bi_{30}Sb_{25}S_{45}Ce_{20}$ | 6.5 |
| $Bi_{15}Sb_{35}Te_{59}Zn_1$ | 7.0 |
| $Bi_{10}Sb_{30}Te_{59}Ce_1$ | 6.9 |
| $Bi_{10}Sb_{30}Se_{55}Zn_5$ | 7.1 |
| $Bi_{14.95}Sb_{30}Se_{45}Ce_{0.05}$ | 6.9 |
| $Bi_{10}Sb_{20}S_2Te_{50}Zn_{18}$ | 6.9 |
| $Bi_{10}Sb_{20}S_5Te_{51}Ce_{14}$ | 7.1 |
| $Bi_{10}Sb_{25}S_{10}Se_{40}Zn_{15}$ | 7.0 |
| $Bi_{14}Sb_{30}S_{10}Se_{30}Ce_{16}$ | 7.2 |
| $Bi_{33.1}Sb_{37}Te_{52.4}Se_{3.8}Zn_8$ | 7.2 |
| $Bi_{33.1}Sb_{3.7}Te_{52.4}Se_{2.8}Ce_8$ | 7.1 |
| $Bi_{34.4}Sb_{3.6}S_{0.7}Te_{51.3}Se_{2.0}Zn_{10}$ | 7.3 |
| $Bi_{32.4}Sb_{3.6}S_{0.7}Te_{51.3}Se_{2.0}Ce_{10}$ | 7.3 |
| $Sb_{33}S_{62}Zn_5$ | 6.5 |
| $Sb_{33}S_{62}Ce_5$ | 6.5 |

TABLE 4

| COMPOSITION (SPECIMENS) | $Z \times 10^3$ (1/K) |
|---|---|
| $Sb_{32}Te_{67}Zn_1$ | 6.6 |
| $Sb_{32}Te_{67}Ce_1$ | 6.4 |
| $Sb_{35}Se_{60}Zn_5$ | 6.7 |
| $Sb_{35}Se_{60}Ce_5$ | 6.6 |
| $Bi_{35}S_5Te_{45}Zn_{15}$ | 6.8 |
| $Bi_{35}S_5Te_{45}Ce_{15}$ | 6.9 |
| $Bi_{35}S_5Se_{40}Zr_{20}$ | 6.5 |
| $Bi_{35}S_5Se_{40}Ce_{20}$ | 6.4 |
| $Bi_{30}Te_{50}Se_7Zn_{13}$ | 6.4 |
| $Bi_{30}Te_{50}Se_7Ce_{35}$ | 6.5 |
| $Sb_{33}S_7Te_{45}Zn_{15}$ | 6.2 |
| $Sb_{33}S_7Te_{45}Ce_{15}$ | 6.6 |
| $Sb_{32}Te_{50}Se_5Zn_{13}$ | 6.5 |
| $Sb_{32}Te_{50}Se_5Ce_{13}$ | 6.7 |
| $Sb_{30}S_5Se_{51}Zn_{14}$ | 6.7 |
| $Sb_{30}S_5Se_{51}Ce_{14}$ | 6.8 |
| $Bi_{34.4}S_{0.6}Te_{49}Se_2Zn_{14}$ | 7.1 |
| $Bi_{34.4}S_{0.6}Te_{49}Se_2Ce_{14}$ | 6.9 |
| $Sb_{35.8}S_{0.6}Te_{49.6}Se_2Zn_{13}$ | 7.1 |
| $Sb_{34.8}S_{0.6}Te_{49.6}Se_2Ce_{13}$ | 7.1 |

TABLE 5

| COMPOSITION (SPECIMENS) | $Z \times 10^3$ (1/K) |
|---|---|
| $Bi_{32}S_{58}Zr_{10}$ | 6.4 |
| $Bi_{35}S_{57}Ni_8$ | 6.2 |
| $Bi_{34}Te_{51}Zr_{15}$ | 6.6 |
| $Bi_{34}Te_{51}Ni_{15}$ | 6.1 |
| $Bi_{32}Se_{58}Zr_{20}$ | 6.3 |
| $Bi_{28}Te_{62}Ni_{10}$ | 6.2 |
| $Bi_{12}Sb_{30}S_{57.95}Zr_{0.05}$ | 6.2 |
| $Bi_{10}Sb_{25}S_{45}Ni_{20}$ | 6.1 |
| $Bi_{15}Sb_{35}Te_{59}Zr_1$ | 6.5 |
| $Bi_{10}Sb_{30}Te_{59}Ni_1$ | 6.2 |
| $Bi_{10}Sb_{30}Te_{55}Zr_5$ | 6.9 |
| $Bi_{14.45}Sb_{30}Se_{45}Ni_{0.05}$ | 6.3 |
| $Bi_{10}Sb_{20}S_2Te_{50}Zr_{18}$ | 6.8 |
| $Bi_{10}Sb_{20}S_5Te_{51}Ni_{14}$ | 6.1 |
| $Bi_{10}Sb_{25}S_{10}Se_{40}Zr_{15}$ | 6.9 |
| $Bi_{14}Sb_{30}S_{10}Se_{30}Ni_{16}$ | 7.1 |
| $Bi_{33.1}Sb_{3.7}Se_{52.4}Se_{3.8}Zr_8$ | 6.8 |
| $Bi_{33.1}Sb_{3.7}Te_{52.4}Se_{2.8}Ni_8$ | 6.9 |
| $Bi_{31.4}Sb_{3.6}S_{0.7}Te_{51.3}Se_{2.0}Zr_{10}$ | 6.9 |
| $Bi_{32.4}Sb_{3.6}S_{0.7}Te_{51.3}Se_{2.0}Ni_{10}$ | 7.2 |

TABLE 6

| COMPOSITION (SPECIMENS) | $Z \times 10^3$ (1/K) |
|---|---|
| $Sb_{33}S_{62}Zr_5$ | 6.8 |
| $Sb_{33}S_{62}Ni_5$ | 6.3 |
| $Sb_{32}Te_{67}Zr_1$ | 6.9 |
| $Sb_{32}Te_{67}Ni_1$ | 6.2 |
| $Sb_{35}Se_{60}Zr_5$ | 6.8 |
| $Sb_{35}Se_{60}Ni_5$ | 6.3 |
| $Bi_{35}S_5Te_{45}Zr_{15}$ | 6.9 |
| $Bi_{35}S_5Te_{45}Ni_{15}$ | 6.2 |
| $Bi_{35}S_5Se_{40}Zr_{20}$ | 6.8 |
| $Bi_{35}S_5Se_{40}Ni_{20}$ | 6.4 |
| $Bi_{30}Te_{50}Se_7Zr_{13}$ | 6.9 |
| $Bi_{30}Te_{50}Se_7Ni_{13}$ | 6.3 |
| $Sb_{33}S_7Te_{45}Zr_{15}$ | 6.9 |
| $Sb_{33}S_7Te_{45}Ni_{15}$ | 6.9 |
| $Sb_{32}Te_{50}Se_5Zr_{13}$ | 6.7 |
| $Sb_{32}Te_{50}Se_5Ni_{13}$ | 6.9 |
| $Sb_{30}S_5Se_{51}Zr_{14}$ | 7.1 |
| $Sb_{30}S_5Se_{51}Ni_{14}$ | 7.1 |
| $Bi_{34.4}S_{0.6}Te_{49}Se_2Zr_{14}$ | 7.1 |
| $Bi_{34.4}S_{0.6}Te_{49}Se_2Ni_{14}$ | 7.0 |
| $Sb_{39.8}S_{0.6}Te_{49.6}Se_2Zr_{13}$ | 7.1 |

TABLE 6-continued

| COMPOSITION (SPECIMENS) | $Z \times 10^3$ (1/K) |
|---|---|
| $Sb_{34.8}S_{0.6}Te_{49.6}Se_2Ni_{13}$ | 7.0 |

TABLE 7

| COMPOSITION (SPECIMENS) | $Z \times 10^3$ (1 K) |
|---|---|
| $Bi_9Sb_{27}Te_{54}Ti_{10}$ | 6.4 |
| $Bi_{33.4}Sb_{3.6}Te_{51.3}Se_{2.7}Ti_{10}$ | 6.6 |
| $Bi_{32.4}Sb_{3.6}Te_{52.3}S_{1.7}Ti_{10}$ | 6.7 |
| $Bi_9Sb_{27}Te_{54}V_{10}$ | 6.5 |
| $Bi_{32.4}Sb_{3.6}Te_{51.3}Se_{2.7}V_{10}$ | 6.6 |
| $Bi_{33.1}Sb_{3.7}Te_{52.3}S_{2.8}V_8$ | 6.7 |
| $Bi_{8.5}Sb_{25.5}Te_{51}Cr_{15}$ | 6.4 |
| $Bi_{32.4}Sb_{3.6}Te_{51.3}Se_{2.7}Cr_{10}$ | 6.5 |
| $Bi_{34.2}Sb_{3.8}Te_{54.1}S_{2.9}Cr_5$ | 6.4 |
| $Bi_{8.7}Sb_{26.1}Te_{52.2}Mn_{13}$ | 7.1 |
| $Bi_{32.4}Sb_{3.6}Te_{51.3}Se_{2.7}Mn_{10}$ | 7.0 |
| $Bi_{35.3}Sb_{3.9}Te_{55.9}S_{2.9}Mn_2$ | 7.0 |
| $Bi_{8.8}Sb_{26.4}Te_{52.8}Fe_{12}$ | 6.9 |
| $Bi_{32.4}Sb_{3.6}Te_{51.3}Se_{2.7}Fe_{10}$ | 6.8 |
| $Bi_{32.8}Sb_{3.7}Te_{51.8}S_{2.7}Fe_9$ | 6.0 |
| $Bi_9Sb_{27}Te_{54}Co_{10}$ | 6.2 |
| $Bi_{30.6}Sb_{5.4}Te_{51.3}Se_{2.7}Co_{10}$ | 6.3 |
| $Bi_{30.6}Sb_{5.4}Te_{51.3}S_{2.7}Co_{10}$ | 6.4 |
| $Bi_9Sb_{27}Te_{54}Ni_{10}$ | 6.5 |
| $Bi_{30.6}Sb_{5.4}Te_{51.3}Se_{2.7}Ni_{10}$ | 7.0 |
| $Bi_{30.6}Sb_{5.4}Te_{52.3}S_{1.7}Ni_{10}$ | 6.9 |

TABLE 8

| COMPOSITION (SPECIMENS) | $Z \times 10^3$ (1 K) |
|---|---|
| $Bi_9Sb_{27}Te_{54}Cu_{10}$ | 6.3 |
| $Bi_{32.4}Sb_{3.6}Te_{51.3}Se_{2.7}Cu_{10}$ | 6.6 |
| $Bi_{32.4}Sb_{3.6}Te_{52.3}S_{1.7}Cu_{10}$ | 6.6 |
| $Bi_9Sb_{27}Te_{54}Zn_{10}$ | 6.3 |
| $Bi_{32.4}Sb_{3.6}Te_{51.3}Se_{2.7}Zn_{10}$ | 6.7 |
| $Bi_{33.1}Sb_{3.7}Te_{52.4}Se_{2.8}Zn_{18}$ | 6.7 |
| $Bi_{8.5}Sb_{25.5}Te_{51}Zr_{15}$ | 6.4 |
| $Bi_{32.4}Sb_{3.6}Te_{51.3}Se_{2.7}Zr_{10}$ | 6.3 |
| $Bi_{34.2}Sb_{3.8}Te_{54.1}S_{2.9}Zr_5$ | 6.5 |
| $Bi_{8.7}Sb_{26.1}Te_{52.2}Nb_{13}$ | 6.7 |
| $Bi_{32.4}Sb_{3.6}Te_{51.3}Se_{2.7}Nb_{10}$ | 6.8 |
| $Bi_{35.3}Sb_{3.9}Te_{55.9}S_{2.9}Nb_2$ | 6.8 |
| $Bi_{8.8}Sb_{26.4}Te_{52.8}Mo_{12}$ | 6.7 |
| $Bi_{32.4}Sb_{3.6}Te_{51.3}Se_{2.7}Mo_{10}$ | 6.7 |
| $Bi_{32.8}Sb_{3.7}Te_{51.8}S_{2.7}Mo_9$ | 6.8 |
| $Bi_9Sb_{27}Te_{54}Y_{10}$ | 6.8 |
| $Bi_{30.6}Sb_{5.4}Te_{51.3}Se_{2.7}Y_{10}$ | 6.5 |
| $Bi_{30.6}Sb_{5.4}Te_{51.3}S_{2.7}Y_{10}$ | 6.5 |
| $Bi_9Sb_{29}Te_{54}La_{30}$ | 7.1 |
| $Bi_{30.6}Sb_{5.4}Te_{51.3}Se_{2.7}La_{10}$ | 7.0 |
| $Bi_{30.6}Sb_{5.4}Te_{52.3}S_{1.7}La_{10}$ | 6.9 |

TABLE 9

| COMPOSITION (SPECIMENS) | $Z \times 10^3$ (1 K) |
|---|---|
| $Bi_9Sb_{27}Te_{54}Ce_{10}$ | 7.0 |
| $Bi_{32.4}Sb_{3.6}Te_{51.3}Se_{2.7}Ce_{10}$ | 6.8 |
| $Bi_{32.4}Sb_{3.6}Te_{52.3}S_{1.7}Ce_{10}$ | 6.9 |
| $Bi_9Sb_{27}Te_{54}Nb_{10}$ | 6.6 |
| $Bi_{32.4}Sb_{3.6}Te_{51.3}Se_{2.8}Nb_{10}$ | 6.6 |
| $Bi_{33.1}Sb_{3.7}Te_{52.4}Se_{2.8}Nb_{18}$ | 6.7 |
| $Bi_{8.5}Sb_{35.5}Te_{51}Sm_{15}$ | 6.4 |
| $Bi_{32.4}Sb_{3.6}Te_{51.3}Se_{2.7}Sm_{10}$ | 6.3 |
| $Bi_{34.2}Sb_{3.8}Te_{54.1}S_{2.9}Sm_5$ | 6.2 |
| $Bi_{8.7}Sb_{26.1}Te_{52.2}Mm_{13}$ | 6.6 |
| $Bi_{32.4}Sb_{3.6}Te_{51.3}Se_{2.7}Mm_{10}$ | 6.7 |
| $Bi_{35.3}Sb_{3.9}Te_{55.9}S_{2.9}Mm_2$ | 6.8 |

TABLE 9-continued

| COMPOSITION (SPECIMENS) | $Z \times 10^3$ (1/K) |
|---|---|
| $Bi_{8.8}Sb_{26.4}Te_{52}Ti_{12.8}$ | 6.7 |
| $Bi_{32.4}Sb_{3.6}Te_{51.3}Se_2Ti_{10.7}$ | 6.8 |
| $Bi_{32.8}Sb_{3.7}Te_{51}S_{2.7}Ti_{9.8}$ | 6.2 |
| $Bi_9Sb_{25}Te_{54}Mn_{12}$ | 6.3 |
| $Bi_{30.6}Sb_5Te_{51.3}Se_{2.7}Mn_{10.4}$ | 6.7 |
| $Bi_{30.6}Sb_{5.4}Te_{51.3}S_2Mn_{10.7}$ | 6.8 |
| $Bi_9Sb_{25}Te_{54}Zn_{12}$ | 6.6 |
| $Bi_{30.6}Sb_{5.4}Te_{51.3}Se_3Zn_{10.7}$ | 6.4 |
| $Bi_{30.6}Sb_{5.4}Te_{51.3}S_1Zn_{10.7}$ | 6.6 |

TABLE 10

| COMPOSITION (SPECIMENS) | $Z \times 10^3$ (1/K) |
|---|---|
| $(Bi_9Sb_{27}Te_{54}Ti_{10})_{90}(SbI_3)_{10}$ | 8.2 |
| $(Bi_{32.4}Sb_{3.6}Te_{51.3}Se_{2.7}Ti_{10})_{15}(AgI)_5$ | 8.4 |
| $(Bi_{32.4}Sb_{3.6}Te_{52.3}S_{1.7}Ti_{10})_{85}(CuI)_{15}$ | 8.3 |
| $(Bi_9Sb_{27}Te_{54}Mn_{10})_{90}(CuBr)_{10}$ | 8.2 |
| $(Bi_{32.4}Sb_{3.6}Te_{51.3}Se_{3.7}Mn_{10})_{88}Pb_{12}$ | 8.3 |
| $(Bi_{33.1}Sb_{3.7}Te_{52.4}S_{2.8}Mn_8)_{88}(HgBr_2)_{12}$ | 8.4 |
| $(Bi_{8.5}Sb_{25.5}Te_{51}Ni_{15})_{87}(HgCl_2)_{13}$ | 8.6 |
| $(Bi_{32.4}Sb_{3.6}Te_{51.3}Se_{2.7}Ni_{10})_{95}Cd_3$ | 8.2 |
| $(Bi_{34.2}Sb_{3.8}Te_{54.1}S_{2.9}Ni_5)_{90}Li_{10}$ | 8.7 |
| $(Bi_{8.7}Sb_{26.1}Te_{52.2}Zn_{13})_{87}Ag_{13}$ | 8.6 |
| $(Bi_{33.4}Sb_{3.6}Te_{51.5}Se_{2.7}Zn_{10})_{99.5}(Sb_{13})_{0.3}$ | 8.9 |
| $(Bi_{35.3}Sb_{3.9}Te_{55.9}S_{2.9}Zn_2)_{98}(CuI)_2$ | 8.9 |
| $(Bi_{8.8}Sb_{26.4}Te_{52.8}Zr_{12})_{33}(CuBr)_7$ | 9.1 |
| $(Bi_{32.4}Sb_{3.6}Te_{51.3}Se_{2.7}Zr_{10})_{94}(AgI)_7$ | 8.8 |
| $(Bi_{32.8}Sb_{3.7}Te_{51.8}S_{2.7}Zr_9)_{90}Li_{10}$ | 8.2 |
| $(Bi_9Sb_{27}Te_{54}Y_{10})_{88}(SbI_3)_{12}$ | 8.9 |
| $(Bi_{30.6}Sb_{5.4}Te_{51.3}Se_{2.7}Y_{10})_{88}Pb_{12}$ | 8.8 |
| $(Bi_{30.6}Sb_{5.4}Te_{51.3}S_{2.7}Y_{10})_{98}(CuI)_9$ | 8.2 |
| $(Bi_9Sb_{27}Te_{54}Ce_{10})_{89}(AgI)_{11}$ | 8.8 |
| $(Bi_{30.1}Sb_{5.4}Te_{51.3}Se_{2.7}Ce_{10})_{88}(SbI_3)_{12}$ | 8.7 |
| $(Bi_{30.6}Sb_{5.4}Te_{52.3}S_{1.7}Ce_{10})_{87}(HgCl_2)_{13}$ | 8.1 |

TABLE 11

| COMPOSITION (COMPARATIVE SAMPLES) | $Z \times 10^3$ (1/K) |
|---|---|
| $(Bi_9Sb_{27}Te_{54}Ti_{10})_{80}Pb_{20}$ | 0.7 |
| $(Bi_{32.4}Sb_{3.6}Te_{51.3}Se_{2.7}Ti_{10})_{70}Cd_{30}$ | 0.9 |
| $(Bi_{32.4}Sb_{3.6}Te_{52.3}S_{1.7}Ti_{10})_{60}Li_{40}$ | 0.3 |
| $(Bi_9Sb_{27}Te_{54}Mn_{10})_{75}(CuBr)_{25}$ | 0.4 |
| $(Bi_{32.4}Sb_{3.6}Te_{51.3}Se_{2.7}Mn_{10})_{83}Au_{17}$ | 0.9 |
| $(Bi_{33.1}Sb_{3.7}Te_{52.4}S_{3.8}Mn_8)_{75}(SbI_3)_{25}$ | 0.8 |
| $(Bi_{8.5}Sb_{25.5}Te_{51}Ni_{15})_{80}(HgCl_2)_{20}$ | 0.7 |
| $(Bi_{32.4}Sb_{3.6}Te_{51.3}Se_{2.7}Ni_{10})_{80}(AgI)_{20}$ | 0.9 |
| $(Bi_{34.2}Sb_{3.8}Te_{54.1}S_{2.9}Ni_5)_{70}Cd_{30}$ | 0.7 |
| $(Bi_{8.7}Sb_{26.1}Te_{52.2}Zn_{13})_{75}(CuZ)_{25}$ | 0.8 |
| $(Bi_{33.4}Sb_{3.6}Te_{51.5}Se_{2.7}Zn_{10})_{70}(AgI)_{30}$ | 0.7 |
| $(Bi_{35.3}Sb_{3.9}Te_{55.9}S_{2.9}Zn_2)_{78}(SbI_3)_{22}$ | 0.6 |
| $(Bi_{8.8}Sb_{36.4}Te_{52.8}Zr_{12})_4(HgBr_2)_{26}$ | 0.6 |
| $(Bi_{32.4}Sb_{3.6}Te_{51.3}Se_{2.7}Zr_{10})_{82}Li_{18}$ | 0.4 |
| $(Bi_{32.8}Sb_{3.7}Te_{51.8}S_{2.7}Zr_9)_{83}(CuBr)_{27}$ | 0.9 |
| $(Bi_9Sb_{27}Te_{54}Y_{10})_{75}Pb_{25}$ | 0.3 |
| $(Bi_{30.6}Sb_{5.4}Te_{51.3}Se_{2.7}Y_{10})_{80}Cd_{20}$ | 0.4 |
| $(Bi_{30.6}Sb_{5.4}Te_{51.3}S_{2.7}Y_{10})_{83}Li_{17}$ | 0.5 |
| $(Bi_9Sb_{27}Te_{54}Ce_{10})_{80}(CuI)_{20}$ | 0.9 |
| $(Bi_{30.6}Sb_{5.4}Te_{51.3}Se_{2.7}Ce_{10})_{75}Li_{25}$ | 0.8 |
| $(Bi_{30.6}Sb_{5.4}Te_{52.3}S_{1.7}Ce_{10})_{71}Ag_{29}$ | 0.5 |

TABLE 12

| COMPOSITION (COMPARATIVE SAMPLES) | $Z \times 10^3$ (1/K) |
|---|---|
| $Bi_{18}Te_{80}Ti_1$ | 0.9 |
| $Bi_{10}Sb_5Te_{74}V_{11}$ | 0.7 |

TABLE 12-continued

| COMPOSITION (COMPARATIVE SAMPLES) | $Z \times 10^3$ (1/K) |
|---|---|
| $Bi_{10}Sb_5Te_3Se_{92}Cr_{10}$ | 0.4 |
| $Bi_7Sb_5S_4Se_{70}Mn_{14}$ | 0.5 |
| $Bi_{10}Sb_5Te_3Se_{72}Fe_{10}$ | 0.7 |
| $Bi_4Sb_{10}S_2Te_{70}Se_5Co_9$ | 0.6 |
| $Bi_{15}Te_{80}Ni_5$ | 0.3 |
| $Bi_{62}Se_{30}Cu_8$ | 0.3 |
| $Bi_{10}Sb_{35}Te_{32}Zn_3$ | 0.6 |
| $Bi_{32}Sb_{33}S_5Te_{25}Zr_5$ | 0.7 |
| $Bi_{11}Sb_{55}Te_{30}Se_1Nb_3$ | 0.9 |
| $Bi_{10}Sb_{56}S_2Te_{30}Se_1Mo_1$ | 0.8 |
| $Bi_{50}Te_{35}Y_{15}$ | 0.9 |
| $Bi_{20}Sb_{35}S_{35}La_{10}$ | 0.8 |
| $Bi_{20}Sb_{35}Te_{32}Ce_{13}$ | 0.6 |
| $Bi_{10}Sb_{40}S_4Te_{32}Nb_{14}$ | 0.4 |
| $Bi_7Sb_{42}Te_{32}Se_3Sm_{16}$ | 0.4 |
| $Bi_5Sb_{42}Te_{30}Se_3Mn_{18}$ | 0.7 |
| $Bi_8Te_{90}Ti_2$ | 0.6 |
| $Bi_2Sb_6S_{85}V_7$ | 0.9 |

TABLE 13

| COMPOSITION (COMPARATIVE SAMPLES) | $Z \times 10^3$ (1/K) |
|---|---|
| $Bi_2Sb_8S_7Te_{80}Cr_3$ | 0.8 |
| $Bi_3Sb_9S_6Se_{75}Mn_7$ | 0.9 |
| $Bi_7Sb_3Te_{10}Se_{75}Pe_5$ | 0.7 |
| $Bi_3Sb_8S_2Te_{70}Se_{10}Co_7$ | 0.8 |
| $Bi_{40}Te_{59.59}Ni_{0.01}$ | 0.9 |
| $Bi_{38}Sb_{60}S_{1.99}Cu_{0.01}$ | 0.8 |
| $Bi_{10}Sb_{30}Te_{59.97}Zn_{0.03}$ | 0.7 |
| $Bi_{20}Sb_{20}S_3Te_{56.98}Zr_{0.02}$ | 0.6 |
| $Bi_{10}Sb_{30}Te_{55}Se_{1.97}Nb_{0.03}$ | 0.8 |
| $Bi_{10}Sb_{30}S_2Te_{55}Se_{3.18}Mo_{0.02}$ | 0.7 |
| $Bi_{25}Te_{45}Y_{30}$ | 0.9 |
| $Bi_{20}Se_{40}La_{40}$ | 0.8 |
| $Bi_{10}Sb_{20}S_{40}Ce_{30}$ | 0.9 |
| $Bi_{15}Sb_{22}Te_{40}Nd_{23}$ | 0.8 |
| $Bi_{10}Sb_{20}Se_{40}Sn_{30}$ | 0.4 |
| $Bi_{15}Sb_{16}S_{10}Te_{30}Mn_{29}$ | 0.3 |
| $Bi_{10}Sb_{20}S_{10}Se_{30}Ti_{30}$ | 0.2 |
| $Bi_{10}Sb_{20}Te_{30}Se_{10}Mn_{30}$ | 0.8 |
| $Bi_5Sb_{25}S_2Te_{30}Se_8Zn_{30}$ | 0.7 |
| $Bi_{30}S_{40}Zr_{30}$ | 0.7 |

TABLE 14

| COMPOSITION (SPECIMENS) | $Z \times 10^3$ (1/K) |
|---|---|
| $Bi_8Sb_{27}Te_{54}Ti_4V_6$ | 7.2 |
| $Bi_{9.2}Sb_{27.6}Te_{55.2}Ti_5Zn_3$ | 7.3 |
| $Bi_{32.4}Sb_{3.6}Te_{51.3}Se_{2.7}Ti_6V_4$ | 7.2 |
| $Bi_{32.4}Sb_{3.6}Te_{51.3}Se_{2.7}Ti_5Zn_5$ | 7.4 |
| $Bi_{37.4}Sb_{3.6}Te_{52.3}S_{1.7}Ti_8V_2$ | 7.3 |
| $Bi_{32.4}Sb_{3.6}Te_{52.3}S_{1.7}Ti_6Zn_4$ | 7.3 |
| $Bi_9Sb_{27}Te_{54}Ti_5Cr_5$ | 7.1 |
| $Bi_{9.5}Sb_{28.5}Te_{57}Ti_3Zr_2$ | 7.3 |
| $Bi_{32.4}Sb_{2.6}Te_{51.3}Se_{2.7}Ti_6Cr_4$ | 7.0 |
| $Bi_{32.4}Sb_{3.6}Te_{51.3}Se_{2.7}Ti_6Zr_4$ | 7.2 |
| $Bi_{33.1}Sb_{3.7}Te_{52.4}S_{2.8}Ti_7Cr_1$ | 7.1 |
| $Bi_{33.1}Sb_{3.7}Te_{52.4}S_{2.8}Ti_6Zr_2$ | 7.3 |
| $Bi_{8.5}Sb_{25.5}Te_{51}Ti_7Mn_8$ | 7.2 |
| $Bi_{9.6}Sb_{28.8}Te_{57.6}Ti_3Nb_1$ | 7.2 |
| $Bi_{32.4}Sb_{3.6}Te_{51.3}Se_{27}Ti_5Mn_5$ | 7.2 |
| $Bi_{32.4}Sb_{3.6}Te_{51.3}Se_{3.7}Ti_8Nb_2$ | 7.1 |
| $Bi_{34.2}Sb_{3.8}Te_{54.1}S_{2.4}Ti_3Mn_2$ | 7.3 |
| $Bi_{34.2}Sb_{3.8}Te_{54.1}S_{2.9}Ti_8Nb_1$ | 6.9 |
| $Bi_{8.7}Sb_{26.1}Te_{58.2}Ti_8Fe_5$ | 7.1 |
| $Bi_{9.3}Sb_{27.9}Te_{55.8}Ti_5Mo_2$ | 6.8 |

TABLE 15

| COMPOSITION (SPECIMENS) | $Z \times 10^3$ (1/K) |
|---|---|
| $Bi_{22.4}Sb_{3.6}Te_{51.3}Se_{2.7}Ti_9Fe_2$ | 7.2 |
| $Bi_{32.4}Sb_{3.6}Te_{51.3}Se_{2.7}Ti_8Mo_2$ | 6.9 |
| $Bi_{35.3}Sb_{3.9}Te_{59.9}S_{2.9}Ti_1Fe_1$ | 6.9 |
| $Bi_{35.3}Sb_{3.4}Te_{59.9}S_{2.9}Ti_1Mo_1$ | 6.9 |
| $Bi_{8.8}Sb_{26.4}Te_{52.8}Ti_9Co_1$ | 6.9 |
| $Bi_{8.5}Sb_{25.5}Te_{51}Ti_7Y_8$ | 7.1 |
| $Bi_{32.4}Sb_{3.6}Te_{51.3}Se_{2.7}Ti_9Co_1$ | 6.9 |
| $Bi_{38.4}Sb_{3.6}Te_{51.3}Se_{2.7}Ti_4Y_6$ | 7.1 |
| $Bi_{32.8}Sb_{3.7}Te_{51.8}S_{2.7}Ti_8Co_1$ | 6.8 |
| $Bi_{32.8}Sb_{3.7}Te_{51.8}S_{2.7}Ti_3Y_6$ | 7.0 |
| $Bi_9Sb_{27}Te_{54}Ti_8Ni_2$ | 7.1 |
| $Bi_{8.7}Sb_{26.1}Te_{52.2}Ti_6La_7$ | 6.8 |
| $Bi_{30.6}Sb_{5.4}Te_{51.3}Se_{2.7}Ti_8Ni_2$ | 7.2 |
| $Bi_{30.6}Sb_{5.4}Te_{51.3}Se_{2.7}Ti_1La_6$ | 7.1 |
| $Bi_{30.6}Sb_{5.4}Te_{51.3}S_{2.7}Ti_9Ni_1$ | 7.1 |
| $Bi_{30.6}Sb_{5.4}Te_{51.3}S_{2.7}Ti_3La_7$ | 7.2 |
| $Bi_9Sb_{27}Te_{54}Ti_8Cu_2$ | 6.9 |
| $Bi_{8.8}Sb_{26.4}Te_{52.8}Ti_3Ce_9$ | 7.3 |
| $Bi_{30.6}Sb_{5.4}Te_{51.3}Se_{2.7}Ti_7Cu_3$ | 6.9 |
| $Bi_{30.6}Sb_{5.4}Te_{51.3}Se_{2.7}Ti_4Ce_6$ | 7.1 |

TABLE 16

| COMPOSITION (SPECIMENS) | $Z \times 10^3$ (1/K) |
|---|---|
| $Bi_8Sb_{27}Te_{54}V_6Ce_4$ | 6.8 |
| $Bi_{9.2}Sb_{27.6}Te_{55.2}Mn_4Y_4$ | 7.1 |
| $Bi_{32.4}Sb_{3.6}Te_{51.3}Se_{2.7}V_7Ce_3$ | 6.8 |
| $Bi_{32.4}Sb_{3.6}Te_{51.3}Se_{2.7}Mn_6Y_4$ | 7.2 |
| $Bi_{32.4}Sb_{3.6}Te_{52.3}S_{1.7}V_6Ce_4$ | 6.7 |
| $Bi_{32.4}Sb_{3.6}Te_{52.3}S_{1.7}Mn_6Y_4$ | 7.1 |
| $Bi_9Sb_{27}Te_{54}Mn_6Co_2$ | 7.0 |
| $Bi_{9.5}Sb_{28.5}Te_{57}Mn_4La_1$ | 7.1 |
| $Bi_{32.4}Sb_{3.6}Te_{51.3}Se_{2.7}Mn_8Co_2$ | 7.0 |
| $Bi_{32.4}Sb_{3.6}Te_{51.3}Se_{2.7}Mn_6La_4$ | 7.2 |
| $Bi_{33.1}Sb_{3.7}Te_{52.4}S_{2.8}Mn_6Co_2$ | 6.9 |
| $Bi_{33.1}Sb_{3.7}Te_{52.4}S_{2.8}Mn_4La_4$ | 7.3 |
| $Bi_{8.5}Sb_{25.5}Te_{51}Mn_{11}Ni_4$ | 6.8 |
| $Bi_{9.6}Sb_{28.8}Te_{57.6}Mn_2Ce_2$ | 7.3 |
| $Bi_{32.4}Sb_{3.6}Te_{51.3}Se_{2.7}Mn_7Ni_3$ | 6.7 |
| $Bi_{32.4}Sb_{3.6}Te_{51.3}Se_{2.7}Mn_1Ce_4$ | 7.2 |
| $Bi_{34.2}Sb_{3.8}Te_{54.1}S_{2.9}Mn_1Ni_2$ | 6.8 |
| $Bi_{34.2}Sb_{3.8}Te_{54.3}S_{2.9}Mn_3Ce_2$ | 7.2 |
| $Bi_{8.7}Sb_{26.1}Te_{53.2}Mn_8Zn_5$ | 6.9 |
| $Bi_{9.3}Sb_{27.9}Te_{55.8}Mn_4Nd_3$ | 6.9 |

TABLE 17

| COMPOSITION (SPECIMENS) | $Z \times 10^3$ (1/K) |
|---|---|
| $Bi_{32.4}Sb_{3.6}Te_{51.3}Se_{2.7}Mn_8Zn_2$ | 7.1 |
| $Bi_{32.4}Sb_{3.6}Te_{51.3}Se_{2.7}Mn_7Nd_3$ | 6.8 |
| $Bi_{35.3}Sb_{3.9}Te_{59.9}S_{2.9}Mn_1Zn_1$ | 7.2 |
| $Bi_{35.3}Sb_{3.3}Te_{59.9}S_{2.9}Mn_1Nd_1$ | 6.8 |
| $Bi_{8.5}Sb_{26.4}Te_{57.8}Mn_6Zr_6$ | 7.3 |
| $Bi_{8.5}Sb_{25.5}Te_{51}Mn_4Sm_8$ | 6.9 |
| $Bi_{32.4}Sb_{3.6}Te_{51.3}Se_{2.7}Mn_5Zr_5$ | 7.2 |
| $Bi_{32.4}Sb_{3.6}Te_{51.3}Se_{2.7}Mn_5Sm_5$ | 6.7 |
| $Bi_{32.8}Sb_{3.7}Te_{51.8}S_{2.7}Mn_6Zr_3$ | 7.3 |
| $Bi_{32.8}Sb_{3.7}Te_{51.8}S_{2.7}Mn_6Sm_3$ | 6.4 |
| $Bi_8Sb_{27}Te_{54}Mn_8Nb_2$ | 6.9 |
| $Bi_{8.7}Sb_{26.1}Te_{52.2}Zr_8Fe_5$ | 6.3 |
| $Bi_{30.6}Sb_{5.4}Te_{51.3}Se_{2.7}Mn_8Nb_2$ | 6.8 |
| $Bi_{30.6}Sb_{5.4}Te_{51.3}Se_{2.7}Zr_9Fe_1$ | 6.3 |
| $Bi_{30.6}Sb_{5.4}Te_{51.3}S_{2.7}Mn_9Nb_1$ | 6.8 |
| $Bi_{30.6}Sb_{5.4}Te_{51.3}S_{2.7}Zr_9Fe_1$ | 6.3 |
| $Bi_9Sb_{27}Te_{54}Mn_9Mo_1$ | 6.7 |
| $Bi_{8.8}Sb_{26.4}Te_{52.8}Zr_7Ni_5$ | 6.2 |
| $Bi_{30.6}Sb_{5.4}Te_{51.3}Se_{29.9}Mn_4Mo_1$ | 6.7 |
| $Bi_{30.6}Sb_{5.4}Te_{51.3}Se_{2.7}Zr_8Ni_2$ | 6.4 |

TABLE 18

| COMPOSITION (SPECIMENS) | $Z \times 10^3$ (1/K) |
|---|---|
| $Bi_8Sb_{27}Te_{54}Ti_5Nd_5$ | 7.1 |
| $Bi_{9.2}Sb_{27.6}Te_{55.2}V_6Cu_2$ | 6.6 |
| $Bi_{32.4}Sb_{3.6}Te_{51.3}Se_{2.7}Ti_6Nd_4$ | 7.1 |
| $Bi_{32.4}Sb_{3.6}Te_{51.3}Se_{2.7}V_8Cu_2$ | 6.4 |
| $Bi_{32.4}Sb_{3.6}Te_{52.3}S_{1.7}Ti_7Nd_3$ | 7.2 |
| $Bi_{32.4}Sb_{3.6}Te_{53.3}S_{1.7}V_8Cu_2$ | 6.4 |
| $Bi_9Sb_{27}Te_{54}Ti_7Sm_3$ | 7.0 |
| $Bi_{9.5}Sb_{28.5}Te_{57}V_2Zn_3$ | 7.1 |
| $Bi_{32.4}Sb_{3.6}Te_{51.3}Se_{2.7}Ti_6Sm_4$ | 7.0 |
| $Bi_{32.4}Sb_{3.6}Te_{51.3}Se_{2.7}V_3Zn_7$ | 7.2 |
| $Bi_{33.1}Sb_{3.7}Te_{52.4}S_{2.8}Ti_6Sm_2$ | 6.9 |
| $Bi_{33.1}Sb_{3.7}Te_{52.4}S_{2.8}V_2Zn_6$ | 7.1 |
| $Bi_{8.5}Sb_{25.5}Te_{51}Ti_{10}Mm_5$ | 6.7 |
| $Bi_{9.6}Sb_{28.8}Te_{57.6}V_4Zr_3$ | 7.4 |
| $Bi_{32.4}Sb_{3.6}Te_{51.3}Se_{2.7}Ti_8Mn_5$ | 6.6 |
| $Bi_{32.4}Sb_{3.6}Te_{51.3}Se_{2.7}V_3Zr_7$ | 7.3 |
| $Bi_{34.2}Sb_{3.8}Te_{54.1}S_{2.9}Ti_3Mm_2$ | 6.7 |
| $Bi_{34.2}Sb_{3.8}Te_{54.1}S_{2.9}V_1Zr_4$ | 7.4 |
| $Bi_{8.7}Sb_{26.1}Te_{52.2}V_6Mm_7$ | 6.9 |
| $Bi_{9.3}Sb_{27.9}Te_{55.8}V_4Nb_3$ | 6.9 |

TABLE 19

| COMPOSITION (SPECIMENS) | $Z \times 10^3$ (1/K) |
|---|---|
| $Bi_{32.4}Sb_{3.6}Te_{51.3}Se_{2.7}V_4Mm_6$ | 6.8 |
| $Bi_{32.4}Sb_{3.6}Te_{51.3}Se_{2.7}V_8Nb_2$ | 7.0 |
| $Bi_{35.3}Sb_{3.9}Te_{59.4}S_{2.9}V_1Mm_1$ | 6.9 |
| $Bi_{35.3}Sb_{3.4}Te_{59.9}S_{2.9}V_1Nb_1$ | 7.0 |
| $Bi_{8.8}Sb_{26.4}Te_{52.8}V_8Fe_4$ | 6.5 |
| $Bi_{8.5}Sb_{25.5}Te_{51}V_8Mo_7$ | 6.8 |
| $Bi_{32.4}Sb_{3.6}Te_{51.3}Se_{2.7}V_7Fe_3$ | 6.4 |
| $Bi_{32.4}Sb_{3.6}Te_{51.3}Se_{2.7}V_5Mo_5$ | 6.9 |
| $Bi_{32.8}Sb_{3.7}Te_{51.8}S_{2.7}V_6Fe_3$ | 6.4 |
| $Bi_{32.8}Sb_{3.7}Te_{51.8}S_{2.7}V_6Mo_3$ | 7.0 |
| $Bi_8Sb_{27}Te_{54}V_6Cr_4$ | 6.3 |
| $Bi_{8.7}Sb_{26.1}Te_{52.2}V_5Y_8$ | 7.3 |
| $Bi_{30.6}Sb_{5.4}Te_{51.3}Se_{2.7}V_6Cr_4$ | 6.6 |
| $Bi_{30.6}Sb_{5.4}Te_{51.3}Se_{2.7}V_2Y_8$ | 7.4 |
| $Bi_{30.6}Sb_{5.4}Te_{51.3}S_{2.7}V_7Cr_3$ | 6.7 |
| $Bi_{30.6}Sb_{5.4}Te_{51.3}S_{2.7}V_2Y_8$ | 7.3 |
| $Bi_9Sb_{27}Te_{54}V_7Ni_3$ | 6.8 |
| $Bi_{8.8}Sb_{26.4}Te_{52.8}V_5La_7$ | 7.6 |
| $Bi_{30.6}Sb_{5.4}Te_{51.3}Se_{2.7}V_7Ni_3$ | 6.7 |
| $Bi_{30.6}Sb_{5.4}Te_{51.3}Se_{2.7}V_4La_6$ | 7.5 |

TABLE 20

| COMPOSITION (SPECIMENS) | $Z \times 10^3$ (1/K) |
|---|---|
| $Bi_8Sb_{27}Te_{54}Zr_4Y_6$ | 7.4 |
| $Bi_{9.2}Sb_{27.6}Te_{55.2}Zn_5Zr_3$ | 7.4 |
| $Bi_{32.4}Sb_{3.6}Te_{51.3}Se_{2.7}Zr_3Y_7$ | 7.3 |
| $Bi_{32.4}Sb_{3.6}Te_{51.3}Se_{2.7}Zn_4Zr_6$ | 7.3 |
| $Bi_{32.4}Sb_{3.6}Te_{52.3}S_{1.7}Zr_3Y_7$ | 7.4 |
| $Bi_{32.4}Sb_{3.6}Te_{53.3}S_{1.7}Zn_3Zr_7$ | 7.4 |
| $Bi_9Sb_{27}Te_{54}Zr_3Ce_8$ | 7.3 |
| $Bi_{9.5}Sb_{28.5}Te_{57}Zn_4Mo_1$ | 6.9 |
| $Bi_{32.4}Sb_{3.6}Te_{51.3}Se_{2.7}Zr_3Ce_9$ | 7.6 |
| $Bi_{32.4}Sb_{3.6}Te_{51.3}Se_{2.7}Zn_6Mo_4$ | 7.0 |
| $Bi_{33.1}Sb_{3.7}Te_{52.4}S_{2.8}Zr_3Ce_5$ | 7.6 |
| $Bi_{33.1}Sb_{3.7}Te_{52.4}S_{2.8}Zn_6Mo_2$ | 7.1 |
| $Bi_{8.5}Sb_{25.5}Te_{51}Zr_5La_{10}$ | 7.4 |
| $Bi_{9.6}Sb_{28.8}Te_{57.6}Zn_2Y_2$ | 7.5 |
| $Bi_{32.4}Sb_{3.6}Te_{51.3}Se_{2.7}Zr_5La_5$ | 7.2 |
| $Bi_{32.4}Sb_{3.6}Te_{51.3}Se_{2.7}Zn_4Y_6$ | 7.4 |
| $Bi_{34.2}Sb_{3.8}Te_{54.1}S_{1.9}Zr_1La_4$ | 7.2 |
| $Bi_{34.2}Sb_{3.8}Te_{54.1}S_{2.9}Zn_2Y_3$ | 7.6 |
| $Bi_{8.7}Sb_{26.1}Te_{52.2}Zn_9Cr_4$ | 6.9 |
| $Bi_{9.3}Sb_{27.9}Te_{55.8}Zn_2La_5$ | 7.3 |

TABLE 21

| COMPOSITION (SPECIMENS) | $Z \times 10^3$ (1/K) |
|---|---|
| $Bi_{32.4}Sb_{3.6}Te_{51.3}Se_{2.7}Zn_6Cr_2$ | 6.6 |
| $Bi_{32.4}Sb_{3.6}Te_{51.3}Se_{2.7}Zn_6La_9$ | 7.2 |
| $Bi_{35.3}Sb_{3.9}Te_{59.9}S_{2.9}Zn_1Cr_3$ | 6.8 |
| $Bi_{35.3}Sb_{3.9}Te_{59.9}S_{2.9}Zn_2La_1$ | 7.2 |
| $Bi_{8.8}Sb_{26.4}Te_{52.8}Zn_8Fe_4$ | 6.5 |
| $Bi_{8.5}Sb_{25.5}Te_{51}Zn_9Ce_6$ | 7.4 |
| $Bi_{32.4}Sb_{3.6}Te_{51.3}Se_{2.9}Zn_8Fe_2$ | 6.5 |
| $Bi_{32.4}Sb_{3.6}Te_{51.3}Se_{2.7}Zn_8Ce_2$ | 7.4 |
| $Bi_{32.8}Sb_{3.7}Te_{51.8}S_{2.7}Zn_6Fe_3$ | 6.5 |
| $Bi_{32.8}Sb_{3.7}Te_{51.8}S_{2.7}Zn_3Ce_6$ | 7.4 |
| $Bi_8Sb_{27}Te_{54}Zn_8Co_2$ | 6.6 |
| $Bi_{8.7}Sb_{26.1}Te_{52.2}Zn_7Nd_6$ | 7.0 |
| $Bi_{30.6}Sb_{5.4}Te_{51.3}Se_{2.7}Zn_8Co_3$ | 6.5 |
| $Bi_{30.6}Sb_{5.4}Te_{51.3}Se_{2.7}Zn_9Nd_3$ | 7.0 |
| $Bi_{30.6}Sb_{5.4}Te_{51.3}S_{2.7}Zn_8Co_3$ | 6.6 |
| $Bi_{30.6}Sb_{5.4}Te_{51.3}S_{2.7}Zn_7Nd_5$ | 7.0 |
| $Bi_9Sb_{27}Te_{54}Zn_8Ni_2$ | 6.4 |
| $Bi_{8.8}Sb_{26.4}Te_{52.8}Zn_{10}Nb_2$ | 6.5 |
| $Bi_{30.6}Sb_{5.4}Te_{51.3}Se_{2.7}Zn_7Ni_1$ | 6.8 |
| $Bi_{30.6}Sb_{5.4}Te_{51.3}Se_{2.7}Zn_9Nb_1$ | 6.5 |

TABLE 22

| COMPOSITION (COMPARATIVE SAMPLES) | $Z \times 10^3$ (1/K) |
|---|---|
| $Bi_{19}Te_{80}Ti_{0.95}V_{0.05}$ | 0.6 |
| $Bi_{10}Sb_5Te_{74}Ti_6Mn_5$ | 0.5 |
| $Bi_{10}Sb_5Te_3Se_{72}Ti_2Zn_8$ | 0.4 |
| $Bi_7Sb_5S_4Se_{70}Ti_7Ce_7$ | 0.3 |
| $Bi_{10}Sb_5Te_3Se_{72}Mn_5Zr_5$ | 0.4 |
| $Bi_4Sb_{10}S_2Te_{70}Se_5Mn_6Zn_3$ | 0.5 |
| $Bi_{65}Te_{30}Cr_2Ni_3$ | 0.6 |
| $Bi_{62}Se_{30}V_4Y_4$ | 0.4 |
| $Bi_{10}Sb_{55}Te_{32}Ti_2Mn_1$ | 0.3 |
| $Bi_{32}Sb_{33}S_5Te_{25}Ti_2Zn_3$ | 0.2 |
| $Bi_{31}Sb_{55}Te_{10}Se_1Nb_2Y_1$ | 0.3 |
| $Bi_{10}Sb_{56}S_2Te_{30}Se_1Fe_{0.5}Ni_{0.5}$ | 0.3 |
| $Bi_{50}Te_{35}Cr_7Y_8$ | 0.3 |
| $Bi_{20}Sb_{35}S_{35}Co_5Nb_5$ | 0.6 |
| $Bi_{20}Sb_{35}Te_{32}Ti_7Mn_6$ | 0.5 |
| $Bi_{10}Sb_{40}S_4Te_{32}Ti_8Zn_6$ | 0.4 |
| $Bi_7Sb_{42}Te_{32}Se_3Mn_8Zn_8$ | 0.3 |
| $Bi_5Sb_{42}S_2Te_{30}Se_3Mn_{10}Y_8$ | 0.4 |
| $Bi_8Te_{90}Fe_1Co_1$ | 0.4 |
| $Bi_2Sb_5S_{85}Ni_4Y_3$ | 0.4 |

TABLE 23

| COMPOSITION (COMPARATIVE SAMPLES) | $Z \times 10^3$ (1/K) |
|---|---|
| $Bi_2Sb_8S_7Te_{80}Fe_2Mo_1$ | 0.4 |
| $Bi_3Sb_9S_6Se_{75}Zr_3Y_4$ | 0.5 |
| $Bi_7Sb_3Te_{10}Se_{75}Ti_3Mn_2$ | 0.6 |
| $Bi_3Sb_8S_2Te_{70}Se_{10}Nb_4Nd_3$ | 0.7 |
| $Bi_{40}Te_{59.99}V_{0.01}Ni_{0.01}$ | 0.5 |
| $Bi_{38}Sb_{60}S_{1.70}V_{0.01}Zn_{0.01}$ | 0.4 |
| $Bi_{10}Sb_{30}Te_{59.97}Ti_{0.01}Zn_{0.02}$ | 0.5 |
| $Bi_{20}Sb_{20}S_3Te_{56.98}Cr_{0.01}Mo_{0.01}$ | 0.4 |
| $Bi_{10}Sb_{30}Te_{55}Se_{1.97}Mn_{0.01}Zn_{0.02}$ | 0.5 |
| $Bi_{10}Sb_{30}S_2Te_{55}Se_{3.18}Cr_{0.01}Sm_{0.01}$ | 0.4 |
| $Bi_{25}Te_{45}Ni_{15}Sm_{15}$ | 0.5 |
| $Bi_{20}Se_{40}V_{20}Cu_{20}$ | 0.6 |
| $Bi_{10}Sb_{20}S_{40}Cr_{15}Cu_{15}$ | 0.7 |
| $Bi_{15}Sb_{22}Te_{40}Ti_{10}Mn_{13}$ | 0.5 |
| $Bi_{10}Sb_{20}Se_{40}Ti_{15}Zn_{15}$ | 0.6 |
| $Bi_{15}Sb_{16}S_{10}Te_{30}Fe_{19}Nd_{10}$ | 0.4 |
| $(Bi_{15}Sb_{35}Te_{58}Ti_1Cu_1)_{80}(SbI_3)_{20}$ | 0.4 |
| $(Bi_{10}Sb_{20}S_2Te_{50}Co_9Ni_9)_{75}(AgI)_{25}$ | 0.5 |
| $(Bi_{30}Te_{50}Se_5Fe_7Ni_6)_{85}Li_{15}$ | 0.7 |
| $(Bi_{10}Sb_{25}S_{10}Se_{40}V_8Ni_7)_{82}Cd_{18}$ | 0.6 |

TABLE 24

| COMPOSITION (SPECIMENS) | $Z \times 10^3$ (1/K) |
|---|---|
| $Bi_8Sb_{27}Te_{54}Ti_5Cr_3Zn_3$ | 7.4 |
| $Bi_{9.2}Sb_{27.6}Te_{55.2}Ti_5Fe_1Zn_2$ | 7.3 |
| $Bi_{32.4}Sb_{3.6}Te_{51.3}Se_{2.7}Ti_6Cr_1Zn_3$ | 7.3 |
| $Bi_{32.4}Sb_{3.6}Te_{51.3}Se_{2.7}Ti_7Fe_1Zn_2$ | 7.2 |
| $Bi_{32.4}Sb_{3.6}Te_{52.3}S_{1.7}Ti_6Cr_1Zn_3$ | 7.2 |
| $Bi_{32.4}Sb_{3.6}Te_{53.3}S_{1.7}Ti_6Fe_1Zn_3$ | 7.4 |
| $Bi_9Sb_{27}Te_{54}Ti_5Cr_1Y_4$ | 7.4 |
| $Bi_{9.5}Sb_{28.5}Te_{57}Ti_2Fe_1Ce_2$ | 7.5 |
| $Bi_{32.4}Sb_{3.6}Te_{51.3}Se_{2.7}Ti_5Cr_1Y_4$ | 7.6 |
| $Bi_{32.4}Sb_{3.6}Te_{51.3}Se_{2.7}Ti_6Fe_1Ce_3$ | 7.6 |
| $Bi_{33.1}Sb_{3.7}Te_{52.4}S_{2.8}Ti_4Cr_3Y_2$ | 7.3 |
| $Bi_{33.1}Sb_{3.7}Te_{52.4}S_{2.8}Ti_4Fe_1Ce_3$ | 7.1 |
| $Bi_{8.5}Sb_{25.5}Te_{51}Ti_{10}Cr_1Ce_4$ | 7.2 |
| $Bi_{9.6}Sb_{28.8}Te_{57.6}V_1Mn_2Zn_1$ | 7.2 |
| $Bi_{32.4}Sb_{3.6}Te_{51.3}Se_{1.7}Ti_4Cr_1Ce_6$ | 7.4 |
| $Bi_{32.4}Sb_{3.6}Te_{51.3}Se_{2.7}V_2Mn_6Zn_2$ | 7.3 |
| $Bi_{34.2}Sb_{3.8}Te_{54.1}S_{2.9}Ti_2Mn_2Ce_1$ | 7.2 |
| $Bi_{34.2}Sb_{3.8}Te_{54.1}S_{2.9}V_1Mn_2Zn_2$ | 7.4 |
| $Bi_{8.7}Sb_{26.1}Te_{52.2}Ti_8Mn_3Zn_2$ | 6.9 |
| $Bi_{9.3}Sb_{27.9}Te_{55.8}V_1Mn_5Y_1$ | 7.2 |

TABLE 25

| COMPOSITION (SPECIMENS) | $Z \times 10^3$ (1 K) |
|---|---|
| $Bi_{32.4}Sb_{3.6}Te_{51.3}Se_{2.7}Ti_6Mn_2Zn_2$ | 7.1 |
| $Bi_{32.4}Sb_{3.8}Te_{51.3}Se_{2.7}V_1Mn_5Y_4$ | 7.3 |
| $Bi_{35.3}Sb_{3.9}Te_{54.9}S_{2.9}Ti_2Mn_{0.5}Zn_{0.5}$ | 7.2 |
| $Bi_{35.3}Sb_{3.9}Te_{59.9}S_{2.9}V_{0.3}Mn_1Y_{0.5}$ | 7.2 |
| $Bi_{8.8}Sb_{26.4}Te_{57.8}Ti_6Mn_3Y_3$ | 7.3 |
| $Bi_{8.5}Sb_{25.5}Te_{51}V_2Mn_{10}Ce_3$ | 7.4 |
| $Bi_{32.4}Sb_{3.6}Te_{51.3}Se_{2.7}Ti_5Mn_4Y_1$ | 7.4 |
| $Bi_{32.4}Sb_{3.6}Te_{51.3}Se_{2.7}V_2Mn_5Ce_3$ | 7.3 |
| $Bi_{32.8}Sb_{3.7}Te_{51.8}S_{2.7}Ti_4Mn_3Y_2$ | 7.2 |
| $Bi_{32.8}Sb_{3.7}Te_{51.8}S_{2.7}V_1Mn_5Ce_3$ | 7.2 |
| $Bi_9Sb_{27}Te_{54}Ti_6Mn_2Ce_2$ | 7.3 |
| $Bi_{8.7}Sb_{26.1}Te_{52.2}V_1Mn_8La_4$ | 7.3 |
| $Bi_{30.6}Sb_{5.4}Te_{51.3}Se_{2.7}Ti_6Mn_3Ce_2$ | 7.2 |
| $Bi_{30.6}Sb_{5.4}Te_{51.3}Se_{2.7}V_1Mn_6La_3$ | 7.4 |
| $Bi_{30.6}Sb_{5.4}Te_{51.3}S_{2.7}Ti_6Mn_2Ce_2$ | 7.3 |
| $Bi_{30.6}Sb_{5.4}Te_{51.3}S_{2.7}V_1Mn_6La_3$ | 7.3 |
| $Bi_9Sb_{27}Te_{54}Ti_6Mn_3La_2$ | 7.2 |
| $Bi_{8.8}Sb_{26.4}Te_{52.8}Zr_3Mn_7Zn_2$ | 7.2 |
| $Bi_{30.6}Sb_{5.4}Te_{51.3}Se_{2.7}Ti_6Mn_2La_2$ | 7.4 |
| $Bi_{30.6}Sb_{5.4}Te_{51.3}Se_{2.7}Zr_3Mn_5Zn_2$ | 7.5 |

TABLE 26

| COMPOSITION (SPECIMENS) | $Z \times 10^3$ (1 K) |
|---|---|
| $Bi_9Sb_{27}Te_{54}Zr_8Fe_1Cu_1$ | 7.2 |
| $Bi_{9.2}Sb_{27.6}Te_{55.2}Cr_1Zn_6Y_2$ | 7.5 |
| $Bi_{32.4}Sb_{3.6}Te_{51.3}Se_{2.7}Zr_9Fe_1Cu_2$ | 7.2 |
| $Bi_{32.4}Sb_{3.6}Te_{51.3}Se_{2.7}Cr_1Zn_6Y_3$ | 7.4 |
| $Bi_{32.4}Sb_{3.6}Te_{52.3}S_{1.7}Zr_7Fe_2Cu_1$ | 7.3 |
| $Bi_{32.4}Sb_{3.6}Te_{53.3}S_{1.7}Cr_1Zn_6Y_3$ | 7.3 |
| $Bi_9Sb_{27}Te_{54}Zr_6Co_1Zn_3$ | 7.1 |
| $Bi_{9.5}Sb_{28.5}Te_{57}Cr_1Zr_3Y_1$ | 7.1 |
| $Bi_{32.4}Sb_{3.6}Te_{51.3}Se_{2.7}Zr_6Co_1Zn_3$ | 7.2 |
| $Bi_{32.4}Sb_{3.6}Te_{51.3}Se_{2.7}Cr_1Zr_6Y_3$ | 7.1 |
| $Bi_{33.1}Sb_{3.7}Te_{52.4}S_{2.8}Zr_4Co_1Zn_2$ | 7.1 |
| $Bi_{33.1}Sb_{3.7}Te_{52.4}S_{2.8}Cr_1Zr_5Y_2$ | 7.3 |
| $Bi_{8.5}Sb_{25.5}Te_{51}Zr_5Mn_5Y_5$ | 7.3 |
| $Bi_{9.6}Sb_{28.8}Te_{57.6}Cr_1Zr_2Ce_1$ | 7.1 |
| $Bi_{32.4}Sb_{3.6}Te_{51.3}Se_{2.7}Zr_3Mn_3Y_2$ | 7.1 |
| $Bi_{32.4}Sb_{3.6}Te_{51.3}Se_{2.7}Cr_1Zr_6Ce_1$ | 7.0 |
| $Bi_{34.2}Sb_{3.8}Te_{54.1}S_{2.9}Zr_3Mn_1Y_2$ | 7.2 |
| $Bi_{34.2}Sb_{3.8}Te_{54.1}S_{2.9}Cr_1Zr_3Ce_1$ | 6.9 |
| $Bi_{8.7}Sb_{26.1}Te_{52.2}Zr_3Mn_2La_3$ | 7.4 |
| $Bi_{9.3}Sb_{27.9}Te_{55.8}Cr_2Nb_1La_4$ | 6.8 |

TABLE 27

| COMPOSITION (SPECIMENS) | $Z \times 10^3 (1 \text{ K})$ |
|---|---|
| $Bi_{32.4}Sb_{3.6}Te_{51.3}Se_{2.7}Zr_2Mn_3La_5$ | 7.2 |
| $Bi_{32.4}Sb_{3.6}Te_{51.3}Se_{2.7}Cu_9Nb_1La_5$ | 7.0 |
| $Bi_{35.3}Sb_{3.9}Te_{59.4}S_{2.9}Zr_1Mn_{0.5}La_{1.5}$ | 7.6 |
| $Bi_{35.3}Sb_{3.4}Te_{59.9}S_{2.9}Cu_{0.5}Nb_{0.5}La_1$ | 6.9 |
| $Bi_{8.8}Sb_{26.4}Te_{52.8}Zr_5Mn_5Ce_2$ | 7.3 |
| $Bi_{8.5}Sb_{25.5}Te_{51}Cu_4Nb_4Nd_7$ | 6.9 |
| $Bi_{32.4}Sb_{3.6}Te_{51.3}Se_{2.7}Zr_2Mn_3Ce_5$ | 7.2 |
| $Bi_{32.4}Sb_{3.6}Te_{51.3}Se_{2.7}Cu_3Nb_2Nd_5$ | 6.8 |
| $Bi_{32.8}Sb_{3.7}Te_{51.8}S_{2.7}Zr_3Mn_3Ce_3$ | 7.4 |
| $Bi_{32.8}Sb_{3.7}Te_{51.8}S_{2.7}Cu_3Nb_3Nd_3$ | 7.0 |
| $Bi_8Sb_{27}Te_{54}Cr_2Ni_2Y_6$ | 7.3 |
| $Bi_{8.7}Sb_{21.1}Te_{52.2}Fe_2Nb_3Nd_8$ | 6.9 |
| $Bi_{30.6}Sb_{5.4}Te_{51.3}Se_{2.7}Cr_2Ni_2Y_6$ | 7.2 |
| $Bi_{30.6}Sb_{5.4}Te_{51.3}Se_{2.7}Fe_4Nb_1Nd_5$ | 6.9 |
| $Bi_{30.6}Sb_{5.4}Te_{51.3}S_{2.7}Cr_1Ni_3Y_6$ | 7.1 |
| $Bi_{30.6}Sb_{5.4}Te_{51.3}S_{2.7}Fe_3Nb_1Nd_6$ | 6.8 |
| $Bi_9Sb_{27}Te_{54}Cr_1Zn_7Ce_2$ | 7.1 |
| $Bi_{8.8}Sb_{21.4}Te_{52.8}Fe_2Nb_2Sm_8$ | 6.8 |
| $Bi_{30.6}Sb_{5.4}Te_{51.3}Se_{2.7}Cr_1Zn_6Ce_3$ | 7.1 |
| $Bi_{30.6}Sb_{5.4}Te_{51.3}Se_{2.7}Fe_2Nb_2Sm_8$ | 6.9 |

TABLE 28

| COMPOSITION (SPECIMENS) | $Z \times 10^3 (1 \text{ K})$ |
|---|---|
| $(Bi_9Sb_{27}Te_{54}Ti_6Mn_4)_{90}(SbI_3)_{10}$ | 8.0 |
| $(Bi_{9.2}Sb_{27.6}Te_{55.2}Ti_5Y_3)_{90}(AgI)_{10}$ | 8.4 |
| $(Bi_{32.4}Sb_{3.6}Te_{51.3}Se_{2.7}Ti_6Mn_4)_{88}(AgI)_{12}$ | 8.1 |
| $(Bi_{32.4}Sb_{3.6}Te_{51.3}Se_{2.7}Ti_5Y_4)_{87}(AgI)_{13}$ | 8.4 |
| $(Bi_{32.4}Sb_{3.6}Te_{52.3}S_{1.7}Ti_6Mn_4)_{92}(CuI)_8$ | 7.9 |
| $(Bi_{32.4}Sb_{3.6}Te_{52.3}S_{2.7}Ti_7Y_3)_{87}(CuI)_{13}$ | 8.4 |
| $(Bi_4Sb_{27}Te_{54}Ti_6Ni_4)_{87}(CuBr)_{13}$ | 8.2 |
| $(Bi_{9.5}Sb_{28.5}Te_{57}Ti_{5.7}Ti_3Mn_1Zn_1)_{86}(CuI)_{14}$ | 8.1 |
| $(Bi_{32.4}Sb_{3.6}Te_{51.3}Se_{2.7}Ti_7Ni_3)_{86}(HgBr_2)_{14}$ | 8.3 |
| $(Bi_{32.4}Sb_{3.6}Te_{51.3}Se_{2.7}Ti_5Mo_2Zn_3)_{87}(HgBr_2)_{13}$ | 8.0 |
| $(Bi_{33.1}Sb_{3.7}Te_{52.4}S_{2.8}Ti_6Ni_2)_{93}(HgCl_2)_7$ | 8.3 |
| $(Bi_{33.1}Sb_{3.7}Te_{33.4}S_{2.8}Ti_4Mn_2Zn_2)_{87}(HgCl_2)_{13}$ | 8.0 |
| $(Bi_{8.5}Sb_{25.5}Te_{51}Ti_{10}Zn_5)_{87}(SbI)_{13}$ | 8.2 |
| $(Bi_{9.6}Sb_{28.8}Te_{57.6}Te_{57.6}Ti_2Mn_1Y_1)_{86}(AgI)_{14}$ | 7.9 |
| $(Bi_{32.4}Sb_{3.6}Te_{51.3}Se_{1.7}Ti_7Zn_3)_{86}(SbI_3)_{14}$ | 8.1 |
| $(Bi_{32.4}Sb_{3.6}Te_{51.3}Se_{3.7}Ti_5Mn_2Y_3)_{86}(AgI)_{14}$ | 7.8 |
| $(Bi_{34.2}Sb_{3.8}Te_{54.3}S_{2.9}Ti_3Zn_2)_{90}(AgI)_{10}$ | 8.0 |
| $(Bi_{34.2}Sb_{3.8}Te_{54.1}S_{2.9}Ti_3Mn_1Y_1)_{86}(CuI)_{14}$ | 8.1 |
| $(Bi_{8.7}Sb_{26.1}Te_{52.2}Ti_7Ce_6)_{88}(CuI)_{12}$ | 8.0 |
| $(Bi_{9.3}Sb_{27.9}Te_{55.3}Ti_4Mn_2Ce_1)_{87}(SbI)_{13}$ | 8.1 |
| $(Bi_{32.4}Sb_{3.6}Te_{51.3}Se_{2.7}Ti_7Ce_3)_{90}(MgBr)_{10}$ | 7.9 |
| $(Bi_{32.4}Sb_{3.6}Te_{51.3}Se_{2.7}Ti_5Mn_3Ce_2)_{86}(SbI_3)_{14}$ | 8.3 |

TABLE 29

| COMPOSITION (SPECIMENS) | $Z \times 10^3 (1 \text{ K})$ |
|---|---|
| $(Bi_{35.3}Sb_{3.9}Te_{59.9}S_{2.9}Ti_1Ce_1)_{80}Ag_{20}$ | 8.1 |
| $(Bi_{35.3}Sb_{3.9}Te_{55.9}S_{2.9}Ti_1Mn_{0.5}Ce_{0.5})_{86}Pb_{14}$ | 8.3 |
| $(Bi_{8.8}Sb_{26.4}Te_{52.8}Zr_3Zn_9)_{90}Li_{10}$ | 8.2 |
| $(Bi_{8.5}Sb_{25.3}Te_{51}Zr_2Mn_1Zn_3)_{93}Li_7$ | 8.4 |
| $(Bi_{32.4}Sb_{3.6}Te_{51.3}Se_{2.7}Zr_3Zn_3)_{90}Pb_{10}$ | 8.1 |
| $(Bi_{32.4}Sb_{3.6}Te_{51}S_3Se_{2.7}Zr_3SS_5Zn_3)_{95}Cd_5$ | 8.5 |
| $(Bi_{32.8}Sb_{3.7}Te_{51.8}S_{2.7}Zr_3Zn_6)_{88}Li_{12}$ | 8.0 |
| $(Bi_{32.4}Sb_{3.6}Te_{51.3}S_{2.7}Zr_2Mn_5Zn_3)_{90}Ag_{10}$ | 8.6 |
| $(Bi_9Sb_{27}Te_{54}Zr_5Ce_5)_{88}Cd_{12}$ | 7.9 |
| $(Bi_{8.7}Sb_{26.1}Te_{52.2}Zr_3Mn_9Ce_3)_{88}(Cu_1)_{12}$ | 8.7 |
| $(Bi_{30}S_6Sb_5S_4Te_{51}S_3Se_{2.7}Zr_4Ce_3)_{87}(SbI_3)_{13}$ | 8.3 |
| $(Bi_{30.1}Sb_{5.4}Te_{51.3}Se_{2.7}Zr_2Mn_3Ce_3)_{87}(CuBr)_{13}$ | 8.8 |
| $(Bi_{30.6}Sb_{5.4}Te_{51.3}S_{2.7}Zr_8Ce_6)_{90}(AgI)_{10}$ | 8.3 |
| $(Bi_{30.6}Sb_{5.4}Te_{51.3}S_{2.7}Zr_2Mn_5Ce_3)_{86}(AgI)_{14}$ | 8.4 |
| $(Bi_9Sb_{27}Te_{54}V_7Ce_3)_{88}(SbI_3)_{12}$ | 8.2 |
| $(Bi_{8.8}Sb_{26.4}Te_{51.8}V_7Mn_3Y_2)_{88}(SbI_3)_{12}$ | 8.4 |
| $(Bi_{30.6}Sb_{5.4}Te_{51.3}Se_{2.7}V_7Ce_3)_{90}Ag_{10}$ | 8.0 |
| $(Bi_{30.6}Sb_{5.4}Te_{51.3}Se_{2.7}V_5Mn_3Y_2)_{88}(HgCl_2)_{12}$ | 8.5 |

TABLE 30

| COMPOSITION (COMPARATIVE SAMPLES) | $Z \times 10^3 (1 \text{ K})$ |
|---|---|
| $Bi_{10}Sb_5Te_3Se_{72}Ti_7Cr_1Zn_2$ | 0.6 |
| $Bi_{10}Sb_{55}Te_{30}Se_1Ti_2Mn_1Zn_1$ | 0.7 |
| $Bi_5Sb_{42}S_2Te_{30}Se_3Ti_{10}Mn_7Ce_1$ | 0.5 |
| $Bi_7Sb_3Te_{10}Se_{75}V_2Mn_2Zn_1$ | 0.4 |
| $Bi_{10}Sb_{30}Te_{55}Se_{4.97}V_{0.01}Mn_{0.01}Ce_{0.01}$ | 0.6 |
| $Bi_{10}Sb_{30}S_2Te_{55}Se_{2.97}Zr_{0.01}Mn_{0.03}Zn_{0.01}$ | 0.7 |
| $Bi_{30}Sb_{20}Te_{30}Se_{10}Zr_{10}Mn_{10}Ce_{10}$ | 0.7 |
| $Bi_5Sb_{25}S_2Te_{30}Se_8Cr_{10}Ni_{10}Y_{10}$ | 0.7 |
| $Bi_{10}Sb_5Te_{44}Cr_2Zn_5Ce_4$ | 0.9 |
| $Bi_{20}Sb_{35}Te_{32}Cr_3Zr_5Y_5$ | 0.8 |
| $(Bi_{10}Sb_{20}S_2Te_{50}Ti_3Cr_5Mn_{10})_{70}Pb_{30}$ | 0.5 |
| $(Bi_{10}Sb_{25}S_{10}Se_{40}Ti_5Mn_5Mo_5)_{70}(CuI)_{30}$ | 0.4 |
| $(Bi_{32}S_{58}V_2Ni_3Cu_5)_{82}(SbI_3)_{18}$ | 0.6 |
| $(Bi_{34}Te_{31}Fe_5Cu_4Ce_6)_{84}(HgCl_2)_{16}$ | 0.5 |
| $(Bi_{32}Sb_{58}Co_7Zn_8Ce_5)_{73}(CuBr)_{27}$ | 0.7 |
| $(Bi_{12}Sb_{30}S_{57.95}Cr_{0.02}Zn_{0.02}S_{0.01})_{75}Cd_{25}$ | 0.8 |
| $(Bi_{15}Sb_{35}Te_{57}V_1Nb_1Nd_1)_{83}(HgBr_2)_{17}$ | 0.9 |
| $(Bi_{10}Sb_{30}Se_{55}Ti_1Cu_3Sm_1)_{80}(HgCl_2)_{20}$ | 0.4 |
| $(Bi_{20}Te_{50}Se_7Mn_3Co_3Y_7)_{80}(SbI_3)_{20}$ | 0.4 |
| $(Sb_{32}Te_{50}Se_5Fe_4Nb_2La_7)_{78}Li_{22}$ | 0.4 |

What is claimed is:

1. A thermoelectric material expressed by the general formula of $\{A_xB'_yC'_z\}_{100-a}D_a$, wherein A is at least one element selected from the group consisting of Bi and Sb, B' is at least one element selected from the group consisting of S, and Se, C' is at least one element selected from the group consisting of Ti, V, Cr, Mn, Fe, Co, Ni, Cu, Zn, Zr, Nb, Mo, Y, La, Ce, Nd, Sm and Mm, D is at least one dopant metal or compound selected from the group consisting of Pb, Cd, Li, Ag, CuI, CuBr, AgI, SbI$_3$, HgBr$_2$ and HgCl$_2$, x, y and z are atomic percent ranging as follows
   x+y+z=100
   20<x<60
   40<y<80
   0.05<z<20, and a is weight percent ranging as follows 0<a<15.

2. The thermoelectric material as set forth in claim 1, in which said thermoelectric material is one of an amorphous phase, a crystallite phase and a mixed phase between said amorphous phase and said crystallite phase.

3. The thermoelectric material as set forth in claim 2, in which said one of said amorphous phase, said crystallite phase and said mixed phase were obtained through a quenching operation at $10^4$ to $10^6$ K°/second.

4. The thermoelectric converting element as set forth in claim 3, in which powder of said one of said amorphous phase, said crystallite phase and said mixed phase is formed into said thermoelectric converting element through a powder solidification technique.

5. A thermoelectric material expressed by the general formula of $\{A_xB'_yC'_z\}_{100-a}D_a$, wherein A is Sb, B' is at least one element selected from the group consisting of S, and Se, C' is at least one element selected from the group consisting of Ti, V, Cr, Mn, Fe, Co, Ni, Cu, Zn, Zr, Nb, Mo, Y, La, Ce, Nd, Sm and Mm, D is at least one dopant metal or compound selected from the group consisting of Pb, Cd, Li, Ag, CuI, CuBr, AgI, SbI$_3$, HgBr$_2$ and HgCl$_2$, x, y and z are atomic percent ranging as follows
x+y+z=100
20<x<60
40<y<80
0.05<z<20; and a is weight percent ranging as follows 0<a<15.

6. The thermoelectric material as set forth in claim 5, in which said thermoelectric material is one of an amorphous phase, a crystallite phase and a mixed phase between said amorphous phase and said crystallite phase.

7. The thermoelectric material as set forth in claim 6, in which said one of said amorphous phase, said crystallite phase and said mixed phase were obtained through a quenching operation at $10^4$ to $10^6$ K°/second.

8. The thermoelectric converting element as set forth in claim 7, in which powder of said one of said amorphous phase, said crystallite phase and said mixed phase is formed into said thermoelectric converting element through a powder solidification technique.

9. A thermoelectric material expressed by the general formula of $\{A_xB'_yC'_z\}_{100-a}D_a$, wherein A is Bi, B' is at least one element selected from the group consisting of S, Te and Se, C' is at least one element selected from the group consisting of Ti, V, Cr, Mn, Fe, Co, Ni, Cu, Zn, Zr, Nb, Mo, Y, La, Ce, Nd, Sm and Mm, D is at least one dopant metal or compound selected from the group consisting of Pb, Cd, Li, Ag, CuI, CuBr, AgI, SbI$_3$, HgBr$_2$ and HgCl$_2$, x, y and z are atomic percent ranging as follows
x+y+z=100
20<x<60
40<y<80
0.05<z<20, and a is weight percent ranging as follows 0<a<15.

10. The thermoelectric material as set forth in claim 9, in which said thermoelectric material is one of an amorphous phase, a crystallite phase and a mixed phase between said amorphous phase and said crystallite phase.

11. The thermoelectric material as set forth in claim 10, in which said one of said amorphous phase, said crystallite phase and said mixed phase were obtained through a quenching operation at $10^4$ to $10^6$ K°/second.

12. The thermoelectric converting element as set forth in claim 11, in which powder of said one of said amorphous phase, said crystallite phase and said mixed phase is formed into said thermoelectric converting element through a powder solidification technique.

13. A thermoelectric material expressed by the general formula of $\{A_xB'_yC'_z\}_{100-a}D_a$, wherein A is at least one element selected from the group consisting of Bi and Sb, B' is at least one element selected from the group consisting of S, Te and Se, C' is at least one element selected from the group consisting of Ti, V, Cr, Mn, Fe, Co, Ni, Zn, Zr, Nb, Mo, Y, La, Ce, Nd, Sm and Mm, D is at least one dopant metal or compound selected from the group consisting of Pb, Cd, Li, Ag, CuI, CuBr, AgI, SbI$_3$, HgBr$_2$ and HgCl$_2$, x, y and z are atomic percent ranging as follows
x+y+z=100
20<x<60
40<y<80
0.05<z<20, and a is weight percent ranging as follows 0<a<15.

14. The thermoelectric material as set forth in claim 13, in which said thermoelectric material is one of an amorphous phase, a crystallite phase and a mixed phase between said amorphous phase and said crystallite phase.

15. The thermoelectric material as set forth in claim 14, in which said one of said amorphous phase, said crystallite phase and said mixed phase were obtained through a quenching operation at $10^4$ to $10^6$ K°/second.

16. The thermoelectric converting element as set forth in claim 15, in which powder of said one of said amorphous phase, said crystallite phase and said mixed phase is formed into said thermoelectric converting element through a powder solidification technique.

* * * * *